United States Patent
Murakami et al.

(10) Patent No.: US 6,873,400 B2
(45) Date of Patent: Mar. 29, 2005

(54) SCANNING EXPOSURE METHOD AND SYSTEM

(75) Inventors: Masaichi Murakami, Machida (JP); Masaki Kato, Yokohama (JP); Katsuya Machino, Yotsukaido (JP); Manabu Toguchi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 8 days.

(21) Appl. No.: 09/772,907

(22) Filed: Jan. 31, 2001

(65) Prior Publication Data

US 2001/0052966 A1 Dec. 20, 2001

(30) Foreign Application Priority Data

Feb. 2, 2000 (JP) .................................. P2000-025661
Feb. 3, 2000 (JP) .................................. P2000-026630

(51) Int. Cl.$^7$ .................. G03B 27/42; G03B 27/54; G03B 27/72
(52) U.S. Cl. ................. 355/53; 355/67; 355/71
(58) Field of Search ............ 355/53, 67, 71; 430/5, 22

(56) References Cited

U.S. PATENT DOCUMENTS

| | | |
|---|---|---|
| 4,769,680 A | 9/1988 | Resor, III et al. |
| 5,291,240 A | 3/1994 | Jain |
| 5,528,118 A | 6/1996 | Lee |
| 5,591,958 A * | 1/1997 | Nishi et al. .................. 250/205 |
| 5,623,853 A | 4/1997 | Novak et al. |
| 5,656,526 A | 8/1997 | Inada et al. |
| 5,729,331 A | 3/1998 | Tanaka et al. |
| 5,784,135 A | 7/1998 | Inada et al. |
| 5,854,671 A * | 12/1998 | Nishi .......................... 355/53 |
| 5,874,820 A | 2/1999 | Lee |
| 5,888,676 A | 3/1999 | Saitoh |
| 6,078,381 A * | 6/2000 | Suzuki ........................ 355/53 |
| 6,295,119 B1 | 9/2001 | Suzuki |
| 6,462,807 B1 * | 10/2002 | Nishi .......................... 355/53 |
| 2001/0041297 A1 | 11/2001 | Nishi |

FOREIGN PATENT DOCUMENTS

| | | |
|---|---|---|
| JP | 7-57986 | 3/1995 |
| JP | A 8-166475 | 6/1996 |
| JP | 8-330224 | 12/1996 |
| JP | 10-64782 | 3/1998 |
| JP | A 11-125912 | 5/1999 |
| WO | WO99/66370 | 12/1999 |

* cited by examiner

Primary Examiner—Alan Mathews
(74) Attorney, Agent, or Firm—Oliff & Berridge PLC

(57) ABSTRACT

It is an object of the present invention to smoothly join divided patterns adjacent to each other in a synchronous moving direction when a mask and a substrate are moved in synchronization, and the divided patterns are joined and picture-synthesized on the substrate. According to the invention, when the mask and the substrate are moved in synchronization with respect to irradiation with an exposing light, the divided patterns of the mask are projected on the substrate, and a plurality of divided patterns adjacent on the substrate are joined and exposed, the divided patterns adjacent to each other in the synchronous moving direction partially overlap each other.

24 Claims, 28 Drawing Sheets

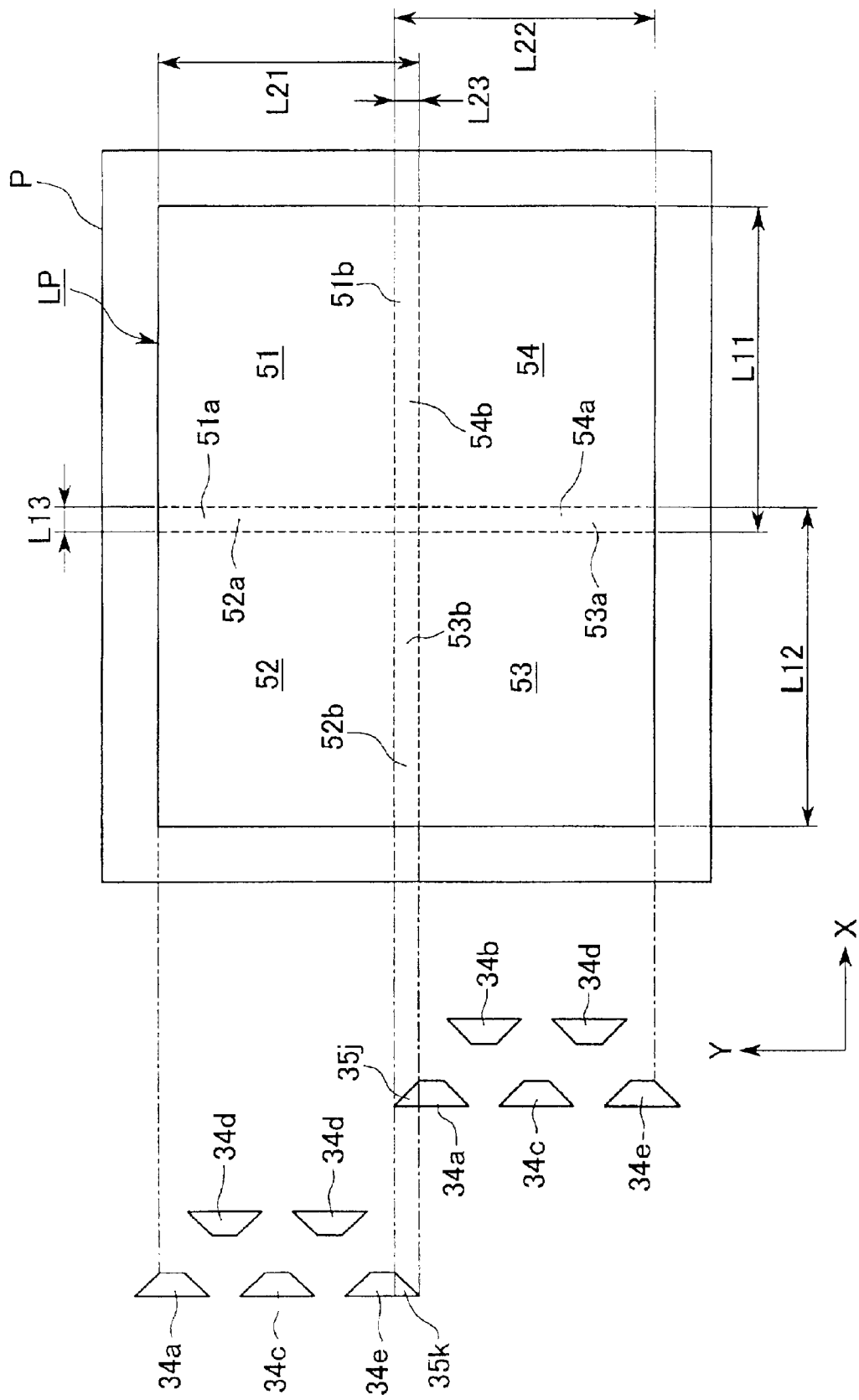

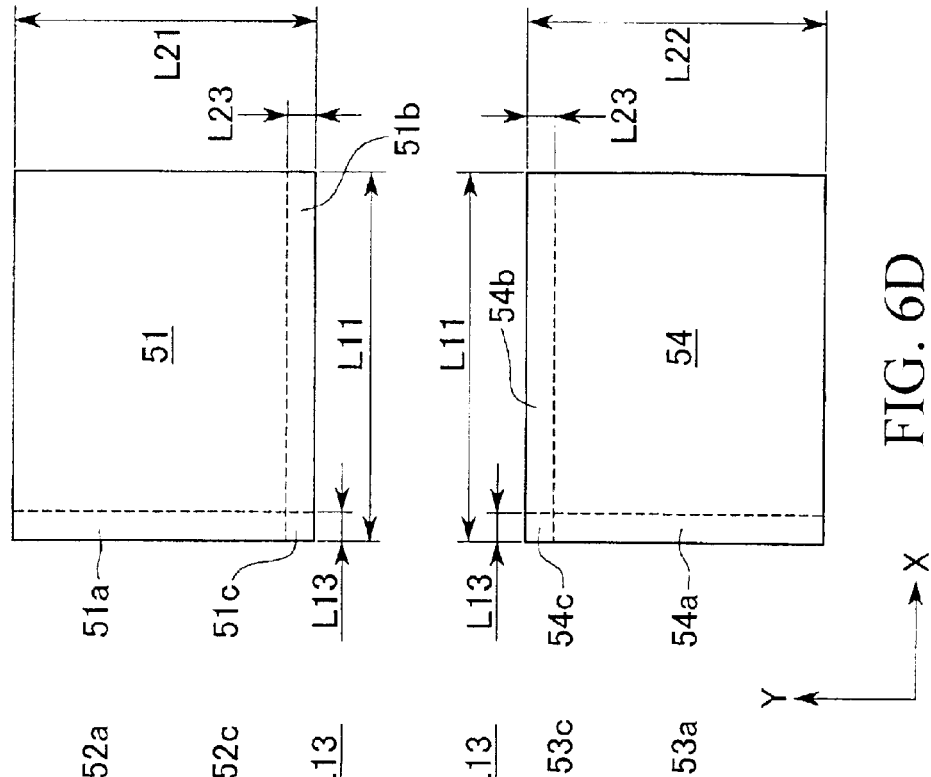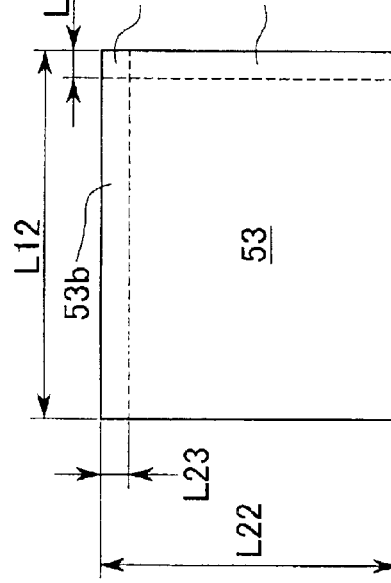

FIG. 9A
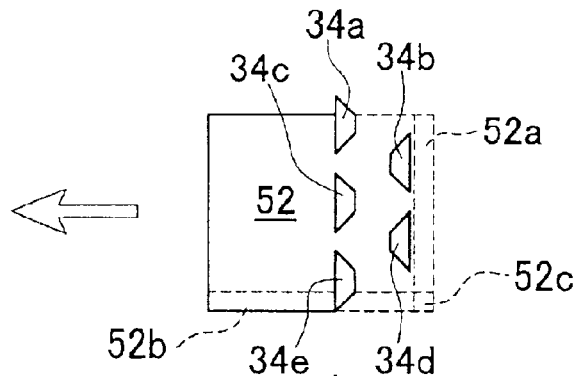
FIG. 9B
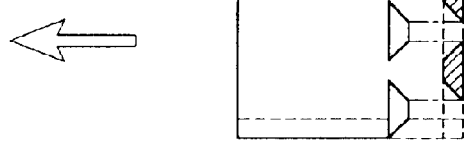
FIG. 9C
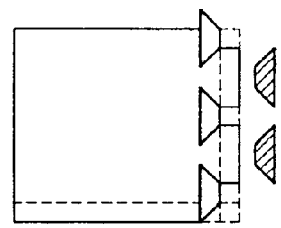
FIG. 9D
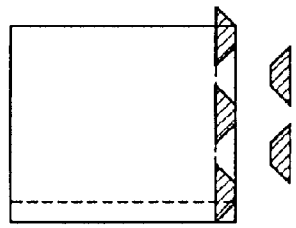
FIG. 9E
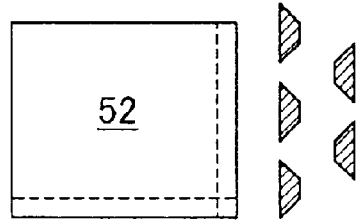
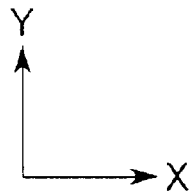

FIG. 10A
OVERLAPPING PART 51c
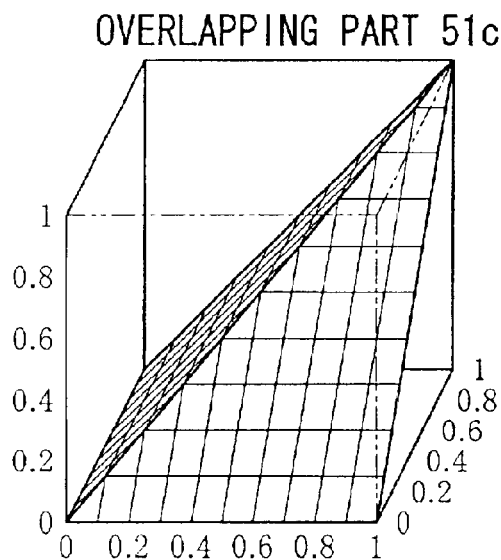
FIG. 10B
OVERLAPPING PART 52c
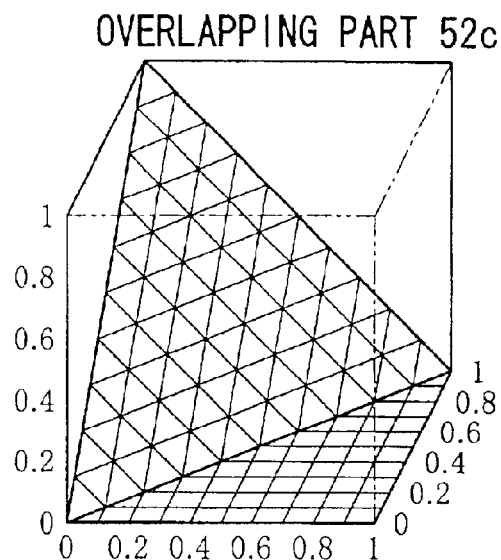
FIG. 10C
OVERLAPPING PART 53c
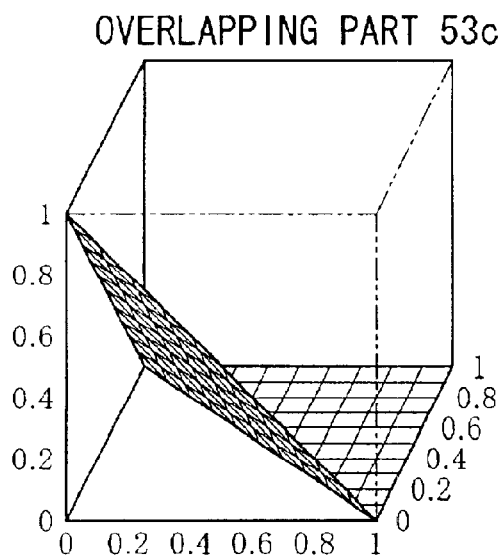
FIG. 10D
OVERLAPPING PART 54c
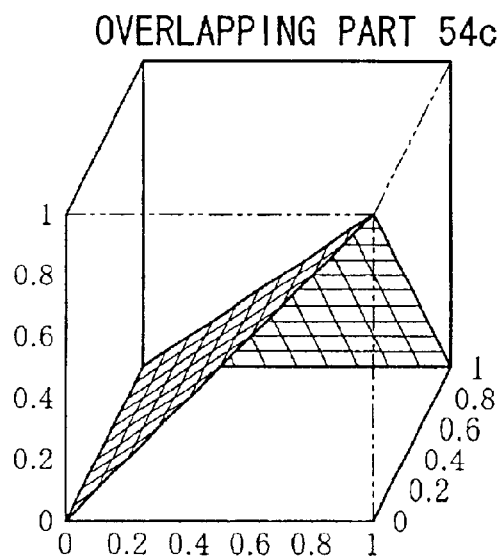
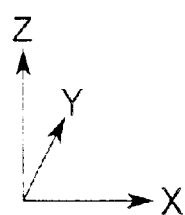

FIG. 12A
OVERLAPPING PART 51e BY END 35a OF PROJECTION REGION
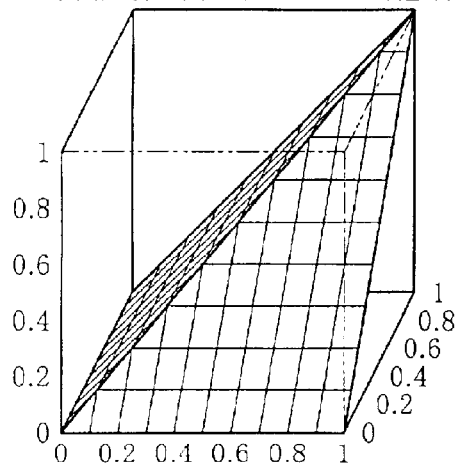
FIG. 12B
OVERLAPPING PART 51e BY END 35b OF PROJECTION REGION
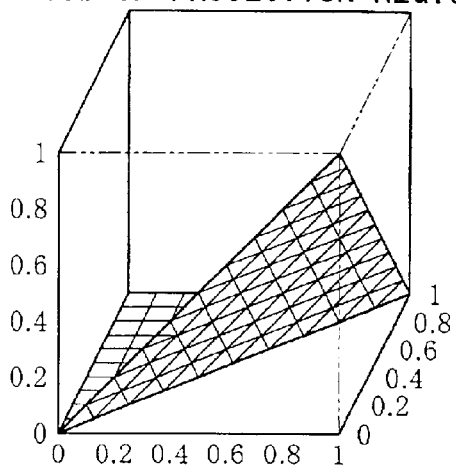
FIG. 12C
OVERLAPPING PART 51f BY END 35d OF PROJECTION REGION
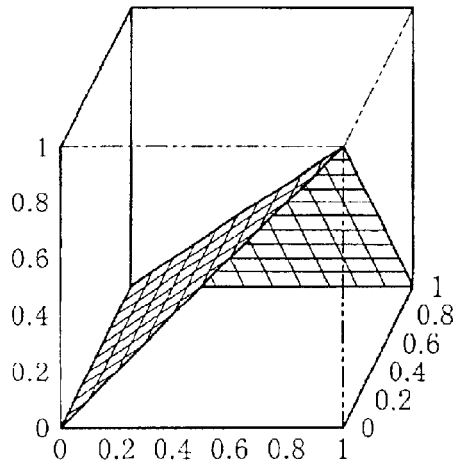
FIG. 12D
OVERLAPPING PART 51f BY END 35c OF PROJECTION REGION
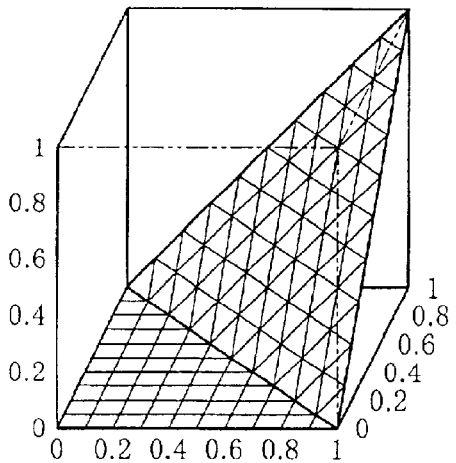
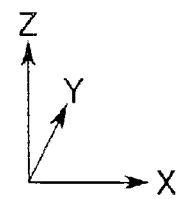

OVERLAPPING PART 51e BY ENDS
35a+35b OF PROJECTION REGIONS
OVERLAPPING PART 51f BY ENDS
35c+35d OF PROJECTION REGIONS

OVERLAPPING PART 52e BY ENDS
35a+35b OF PROJECTION REGIONS
OVERLAPPING PART 52f BY ENDS
35c+35d OF PROJECTION REGIONS

FIG. 14A
OVERLAPPING PARTS 51a, 54a
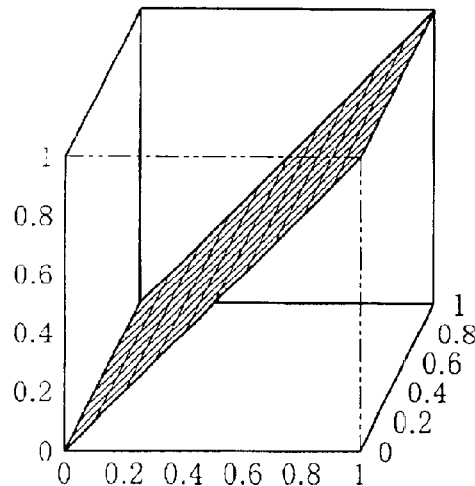
FIG. 14B
OVERLAPPING PARTS 52a, 53a
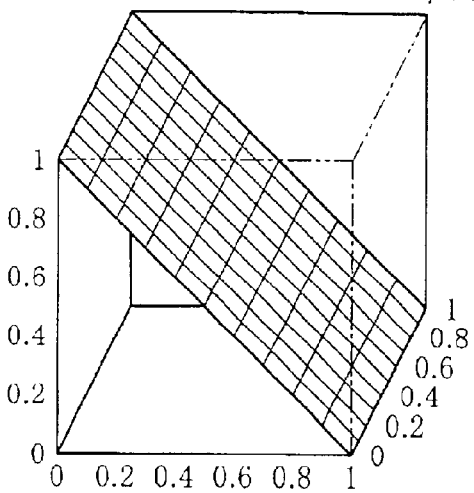
FIG. 14C
OVERLAPPING PARTS 51b, 52b
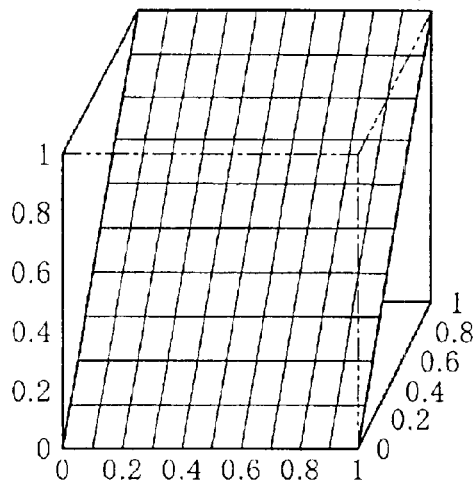
FIG. 14D
OVERLAPPING PARTS 53b, 54b
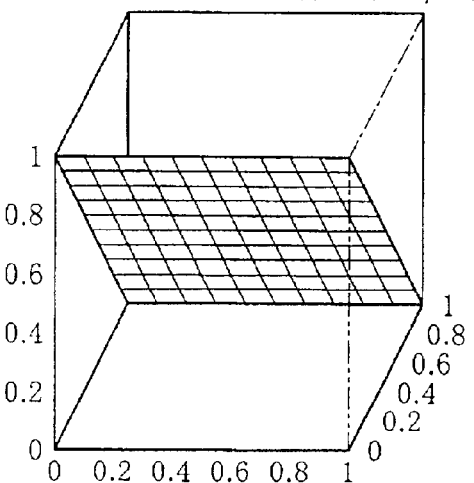
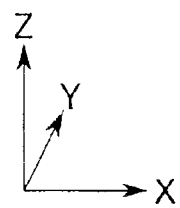

FIG. 15A
OVERLAPPING PART 52e BY END 35a OF PROJECTION REGION
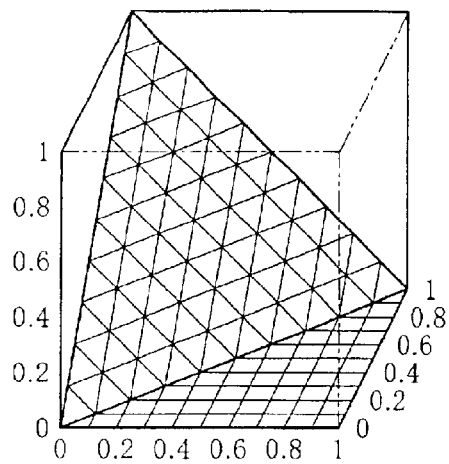
FIG. 15B
OVERLAPPING PART 52e BY END 35b OF PROJECTION REGION
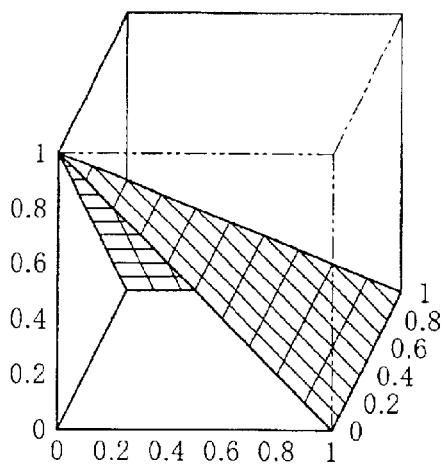
FIG. 15C
OVERLAPPING PART 52f BY END 35d OF PROJECTION REGION
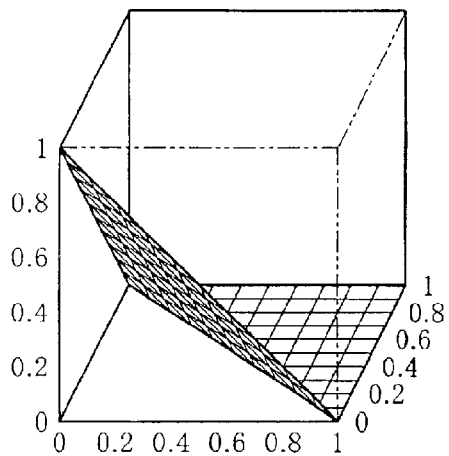
FIG. 15D
OVERLAPPING PART 52f BY END 35c OF PROJECTION REGION
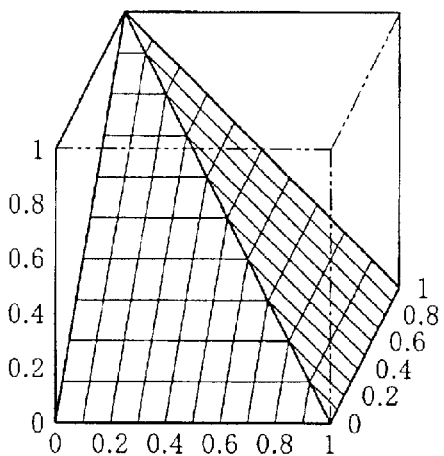
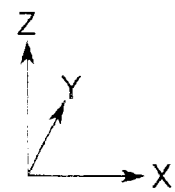

FIG. 17A
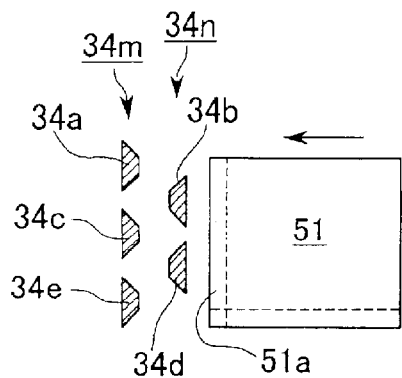
FIG. 17E
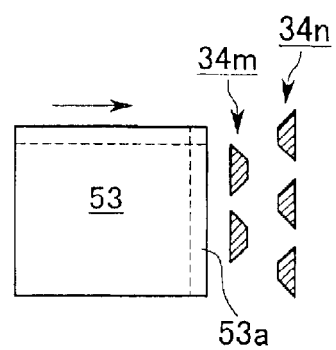
FIG. 17b
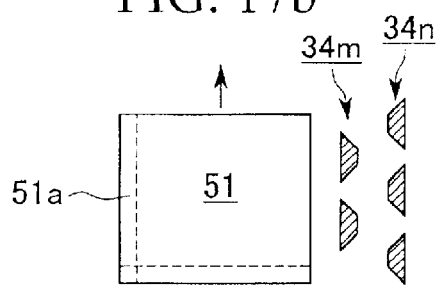
FIG. 17F
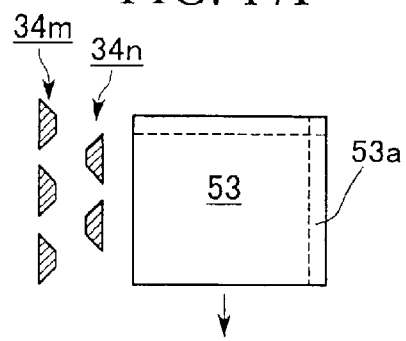
FIG. 17C
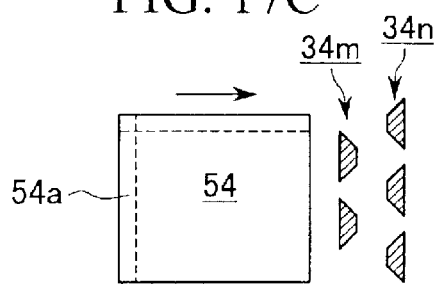
FIG. 17G
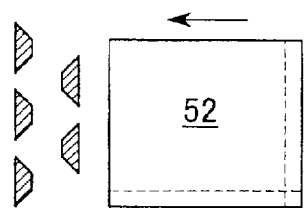
FIG. 17D
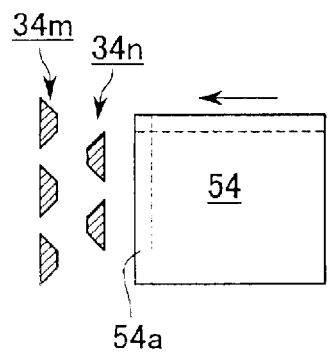
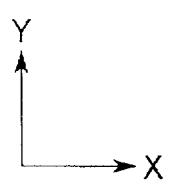

SCANNING EXPOSURE METHOD AND SYSTEM

BACKGROUND OF THE INVENTION

1. Field of the Invention

The present invention relates to a method and a system for scanning exposure, designed to expose a pattern formed in a mask on a substrate by moving the mask and the substrate in a predetermined direction in synchronization. Specifically, the invention relates to a method and a system for scanning exposure, designed to join and expose a plurality of divided patterns adjacent to each other on the substrate. The invention is based on Japanese Patent Applications Nos. 2000-25661 and 2000-26630, the contents of which are incorporated in the present invention.

2. Description of the Related Art

In recent years, as a display element for a personal computer, a television set or the like, liquid crystal display panels which can be made thin have been often used. The liquid crystal display panel of this kind is manufactured by patterning a transparent thin-film electrode in a desired shape on a rectangular photosensitive substrate when seen from above by a photolithographic method. As a photolithographic device for such a purpose, an exposure system has been used, which exposes a pattern formed on a mask (reticle) on a photoresist layer deposited on the photosensitive substrate through a projection optical system.

To enhance the case of viewing the screen, liquid crystal display panels have been greatly enlarged. For example, in the case of a panel for a personal computer, a large type having a size ranging from 307.34 mm (12.1 inch) to 358.14 mm (14.1 inch) has now become common. An example of an exposure system to meet such a demand was disclosed in Japanese Unexamined Patent Application, First Publication No. Hei 7-57986. This is a scanning exposure system invented to sequentially transfer the patterns of a liquid crystal display (LCD) or the like formed on a mask in an exposure region on a glass substrate. The transfer is carried out by combining a plurality of projection optical systems for projecting mask patterns in erect images on the substrate, moving the mask and the glass substrate in a predetermined direction in synchronization, and scanning these with respect to each projection optical system, and a large exposure region is provided in a direction orthogonal to a synchronous moving direction.

In the described case, to obtain good image-forming characteristics without enlarging the exposure system even if the projection region is large, a device is used in which a plurality of projection optical systems are arranged such that projection regions adjacent to each other can be displaced by predetermined amounts in a scanning direction, and the end parts thereof can be overlapped in a direction orthogonal to the scanning direction. In this case, the field diaphragm of each projection optical system is, for example trapezoidal in shape, and the sum of the opening width of the field diaphragm in the scanning direction is set to be always equal. Accordingly, the described scanning exposure system is advantageous in that the joined parts of the projection optical systems adjacent to each other are exposed in overlapped fashion, and optical aberrations and the exposure illuminance of each projection optical system change smoothly.

With regard to a substrate used for manufacturing a liquid crystal display panel, in recent years, an idea has been presented to use a large glass substrate, one side thereof being equal to 50 to 70 cm or more, in order to achieve a higher productivity for simultaneous production of a number of liquid crystal display panels, and to manufacture a liquid crystal display panel having a larger display region for a television set or the like. To expose a substrate of a size equivalent to such a liquid crystal display panel having a large display region, there is a method of executing scanning exposure en bloc by using a mask having a size equal to the substrate size. Another method of dividing the pattern of one liquid crystal display panel into a plurality of regions and synthesizing these is available. The former method can provide high-speed throughput. Usually, however, because of the low pattern accuracy of the mask, it becomes prohibitively expensive to obtain a highly accurate mask for a so-called high-definition panel. Thus, this method lacks practicality.

On the other hand, the latter method needs to manage various errors including a reticle manufacturing error, resulting in complex correction work. In addition, when a correction error remains, it is difficult to obtain good picture synthesizing accuracy. For example, in a pattern joined part, a level difference may occur because of a mask pattern drawing error, the optical aberration of the projection optical system, the positioning error of a stage for moving the glass substrate, or the like, damaging the panel characteristics. Further, in the case of laminating synthesized patterns in multiple layers, the overlap error of the exposure regions of each layer, or pattern line errors discontinuously change in the pattern joined part, causing uneven coloring or the like in the joined part when the liquid crystal display panel is lit. Consequently, a reduction occurs in the quality of the panel.

To execute exposure on a large glass substrate while solving the foregoing problem, a scanning exposure system was disclosed, for example in Japanese Unexamined Patent Application, First Publication No. Hei 10-64782. This system is designed to join and transfer a plurality of divided patterns on a large glass substrate. Specifically, the operation is carried out by repeating, once or several times, a process including: executing scanning exposure by driving a mask stage for holding a mask and a substrate stage for holding the glass substrate in synchronization; then moving, stepwise, the mask stage and the substrate state in a direction orthogonal to the synchronous movement by a distance equivalent to the width of an irradiation region; partially overlapping a following exposure region with a preceding exposure region; and setting the exposure amount (exposing energy amount) of the overlapping part equal to that of a non-overlapping part.

Recently, however, demand for larger liquid crystal display panels has become stronger, requiring exposure on a much larger glass substrates. To meet such a request, a method of synthesizing pictures by joining divided patterns vertically and horizontally may be employed. Conventionally, however, in such a method the divided patterns cannot be joined smoothly in the scanning direction (synchronous moving direction). Thus, there is demand for a method of synthesizing pictures, which is capable of maintaining the device quality even when patterns are joined in the scanning direction as in the case of a non-scanning direction.

In addition, as described above, in the case of joining the divided patterns on the glass substrate by using one reticle, by changing the position of the glass substrate utilizing the characteristic of pattern repetition like the image pattern of a device pattern, exposure is carried out on a plurality of exposure regions while overlapping repetitive patterns among reticle patterns.

However, such image patterns are aligned at 0° or 90° (X or Y direction) to the device pattern. Also, the overlapping parts (picture synthesizing line) of the divided patterns on the glass substrate are frequently set along the 0° or 90° direction as in the case of image patterns. In the liquid crystal device, one problems in terms of display quality during picture synthesizing is an overlap accuracy difference in the process of manufacturing a driving transistor. This is mainly due to the fact that a control error of the driving transistor which causes the overlap accuracy difference between the left and right patterns across the picture synthesizing line, for example, exceeds the performance of the driving transistor and the minimum resolution of the gray scale decided upon by a used liquid crystal material.

Furthermore, if the extending direction of the picture synthesizing line is identical to the arraying direction of image patterns, driving transistors adjacent to the picture synthesizing line are all connected to the same gate line or signal line, and thus driven by the same timing. As a result, the effects of an overlap accuracy difference which is caused by the picture synthesizing on display quality are arranged on a straight line. Normally, if the locations of errors are scattered even when an error is large, the error is not so conspicuous. But the conspicuousness of errors is increased if the errors are arrayed in an orderly manner, even when the error is small. Consequently, if the effects of an overlapping accuracy difference are arranged on a straight line, then the display quality declines.

The present invention was made with the foregoing problems in mind, and the objects of the invention are to provide a method and a system for scanning exposure, capable of smoothly joining divided patterns adjacent to each other in a synchronous moving direction when picture synthesizing is carried out by moving a mask and a substrate in synchronization, and joining the patterns on the substrate. Furthermore, other objects of the invention are to provide a method and a system for scanning exposure, preventing an overlap accuracy difference caused by picture synthesizing from adversely affecting the display quality of a device.

SUMMARY OF THE INVENTION

In order to achieve the foregoing objects, according to the invention, the constitution described below corresponding to FIG. 1 or 19 showing an embodiment is employed.

According to the invention, a scanning exposure method comprises the steps of moving a mask (M) and a substrate (P) in synchronization with respect to a region irradiated with an exposing light; projecting divided patterns (51 to 54) of the mask (M) onto the substrate (P); and joining and exposing the plurality of divided patterns (51 to 54) adjacent to each other on the substrate (P). In this case, the divided patterns (51 and 52, and 53 and 54) adjacent in the synchronous moving direction are partially overlapped with each other.

According to the invention, a scanning exposure system (1) is provided for moving a mask stage (4) holding a mask (M) and a substrate stage (5) holding a substrate (P) in synchronization with respect to a region irradiated with an exposing light, and joining and exposing a plurality of divided patterns (51 to 54) adjacent to each other on the substrate (P). This scanning exposure system comprises: a light-shielding device (12) for blocking/releasing the exposing light; and a control unit (17) for controlling the mask stage (4), the substrate stage (5) and the light-shielding device (12) by changing a state of light shielding of the irradiation region during the synchronous movement to partially overlap the divided patterns (51 and 52, and 53 and 54) adjacent in the synchronous moving direction with each other.

According to the scanning exposure method of the invention, when the divided patterns (51 to 54) are scanned and exposed, in the overlapping parts (51a and 52a, and 53a and 54a) of the divided patterns (51 and 52, and 53 and 54), the amount of exposure (amount of exposure energy) is proportionally reduced towards a boundary. Accordingly, when the overlapping part is exposed, the amount of exposure in this part can be made roughly coincident with that in a non-overlapping part. Thus, for the divided patterns (51 and 52, and 53 and 54) adjacent to each other in the synchronous moving direction, even when a pattern drawing error of the mask (M), optical aberration of a projection optical system (3), positioning errors of the stages (4 and 5) for moving the substrate, or the like, are present, level differences are smoothly changed in the overlapping parts (51a to 54a), and degradations in a device's characteristics can be prevented. The adjustment of the amount of exposure can be executed by switching between irradiation with an exposing light in each of the overlapping parts (51a to 54a) and shielding, when the mask and substrate stages (4 and 5) are moved in synchronization, and the overlapping parts (51a to 54a) of the divided patterns (51 to 54) are positioned in the irradiation regions (34a to 34e) of exposing lights.

Furthermore, in order to achieve the foregoing objects, according to the invention, the constitution described below corresponding to FIGS. 20 to 34 showing an embodiment is employed.

According to the invention, a scanning exposure method comprises the steps of: moving a mask (M) having first and second patterns (P1 and P2), and a substrate (P) in synchronization; and exposing the first and second patterns (P1 and P2) on the substrate (P). In this case, when the first and second patterns (P1 and P2) are exposed along the synchronous moving direction of the substrate (P), a part of the first pattern (P1) and a part of the second pattern (P2) are overlapped and exposed, and the synchronous moving speed of the mask (M) and the substrate (P) during the overlapping exposure is set differently from the synchronous moving speed of the same during non-overlapping exposure.

According to the scanning exposure method of the invention, the amount of exposure (amount of exposure energy) for the overlapping part of the first and second patterns (P1 and P2) can be set differently from that for a non-overlapping part. Thus, when the first and second patterns (P1 and P2) are exposed along the synchronous moving direction, in the overlapping part (JY1) of the patterns (P1 and P2), the amount of exposure (amount of exposure energy) is proportionally reduced towards the boundaries. Accordingly, when exposure is carried out in an overlapping manner, the exposure amount of this part can be made coincident with that of the non-overlapping part. Therefore, for the first and second patterns (P1 and P2), even when a pattern drawing error of the mask (M), optical aberration of the projection optical system (PL), positioning errors of the stages (105 and 106) for moving the substrate, or the like are present, a level difference can be smoothly changed in the overlapping part (JX1), making it possible to prevent degradations of the device's characteristics.

According to the invention, a scanning exposure method comprises the steps of: moving a mask (M) having patterns (P1 and P3), and a substrate (P) in synchronization with respect to a region (S) illuminated with an exposing light; and exposing the patterns on the substrate (P). In this case, the size of the illumination region (S) in a direction different from the synchronous moving direction is changed during the synchronous movement.

According to the invention, a scanning exposure system (101) is provided for moving a mask (M) having patterns (P1 and P3), and a substrate (P) in synchronization, and exposing the patterns (P1 and P3) on the substrate (P). The scanning exposure system comprises: an illumination region setting device (110) for setting an illumination region (S) of the mask (M); and a changing device (114) for changing a size of the illumination region (S) in a direction different from the synchronous moving direction during the synchronous movement.

According to the scanning exposure method and system of the invention, a locus of the end of the illumination region (S) is extended in a direction different from the synchronous moving direction. Thus, the patterns (P1 and P3) exposed while being overlapped with each other on the substrate (P) are illuminated by the end of the illumination region (S), and thereby the direction of the overlapping part (JY1) of the patterns joined on the substrate (P) is set different from the synchronous moving direction. Therefore, even when unit patterns (122) such as pixel patterns are arrayed along the synchronous moving direction, a driving transistor adjacent to a picture-synthesizing line is driven by a different signal line. As a result, even with the same overlap accuracy, it is possible to reduce the effects on display quality.

BRIEF DESCRIPTION OF THE DRAWINGS

FIG. 5 is a plan view showing a relation between a glass substrate and the projection region according to the first embodiment of the invention.

FIGS. 6(*a*) to 6(*d*) are plan views, each schematically showing a divided pattern picture-synthesized on the glass substrate.

FIG. 8(*b*) is a plan view illustrating the process for scanning and exposing the divided pattern, specifically showing a case where an overlapping part positioned in the projection region is irradiated with an exposing light.

FIG. 8(*c*) is a plan view illustrating the process for scanning and exposing the divided pattern, specifically showing a case where an overlapping part positioned in the projection region is irradiated with an exposing light.

FIG. 8(*d*) is a plan view illustrating the process for scanning and exposing the divided pattern, specifically showing the on-going exposure of the divided pattern.

FIG. 8(*e*) is a plan view illustrating the process for scanning and exposing the divided pattern, specifically showing the end of the scanning exposure.

FIG. 9(*a*) is a plan view illustrating a process for scanning and exposing a divided pattern, specifically showing the on-going scanning exposure.

FIG. 9(*b*) is a plan view illustrating the process for scanning and exposing the divided pattern, specifically showing the shielding of an exposing light when an overlapping part is positioned in the projection region.

FIG. 9(*c*) is a plan view illustrating the process for scanning and exposing the divided pattern, specifically showing the on-going scanning exposure.

FIG. 9(*d*) is a plan view illustrating the process for scanning and exposing the divided pattern, specifically showing the shielding of an exposing light when the overlapping part is positioned in the projection region.

FIG. 9(*e*) is a plan view illustrating the process for scanning and exposing the divided pattern, specifically showing the end of the scanning exposure.

FIGS. 10(*a*) to 10(*d*) are views, each showing an exposure amount distribution of an overlapping part.

FIGS. 12(*a*) to 12(*d*) are views, each showing an exposure amount distribution of an overlapped part at an end of the projection region.

FIGS. 14(*a*) to 14(*d*) are views, each showing an exposure amount distribution of overlapping parts.

FIGS. 15(*a*) to 15(*d*) are views, each showing an exposure amount distribution of an overlapping part.

FIGS. 17(*a*) to 17(*g*) are plan views, each illustrating a scanning and exposing process.

DESCRIPTION OF THE PREFERRED EMBODIMENTS

A method and a system for scanning exposure according to a first embodiment of the present invention will be described below with reference to FIGS. 1 to 15. The description will specifically be made of by using the example of using a square glass substrate used as a substrate for manufacturing a liquid crystal display panel, and then transferring the circuit pattern of a liquid crystal display device formed in a mask onto the glass substrate. Also, an example will be given of a case where a projection optical system includes five projection system modules, and picture synthesizing is carried out on the glass substrate by scanning an exposure executed four times.

Figure 1:
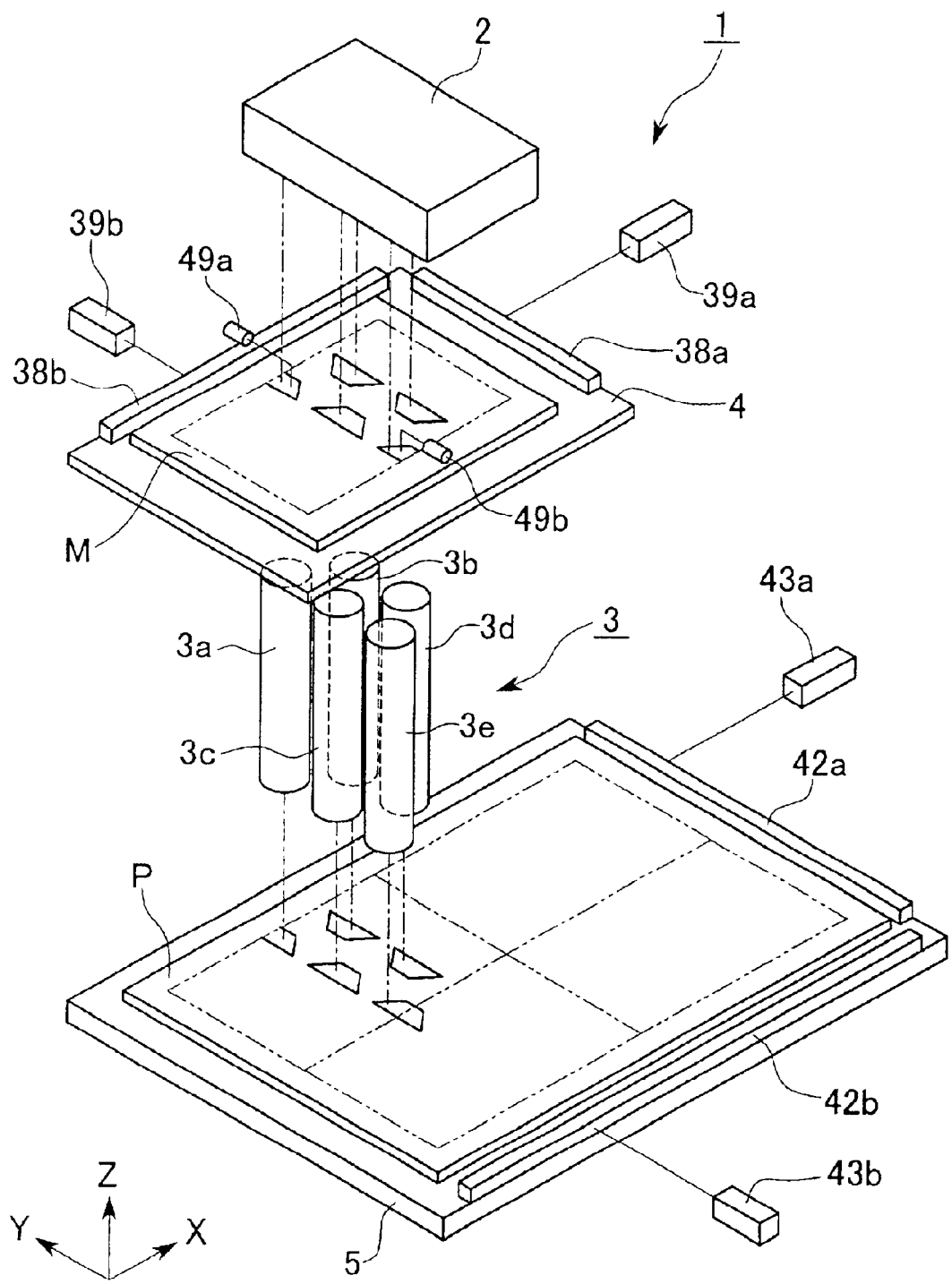
FIG. 1 is a perspective view schematically showing the appearance of a scanning exposure system according to a first embodiment of the invention.

FIG. 1 is a perspective view schematically showing the constitution of a scanning exposure system 1 according to the invention. The scanning exposure system 1 mainly comprises an illumination optical system 2, a projection optical system 3 including a plurality of projection system modules 3a to 3e, a mask stage 4 for holding a mask (reticle) M, and a substrate stage 5 for holding a glass substrate (substrate) P. Hereinbelow, it is assumed that the mask M and the glass substrate P are arranged along an XY plane, and the scanning direction (synchronous moving direction) along the XY plane is set as the X direction; the non-scanning direction orthogonal to the X direction as the Y direction; and the direction of the optical axis orthogonal to the XY plane as the Z direction.

Figure 2:
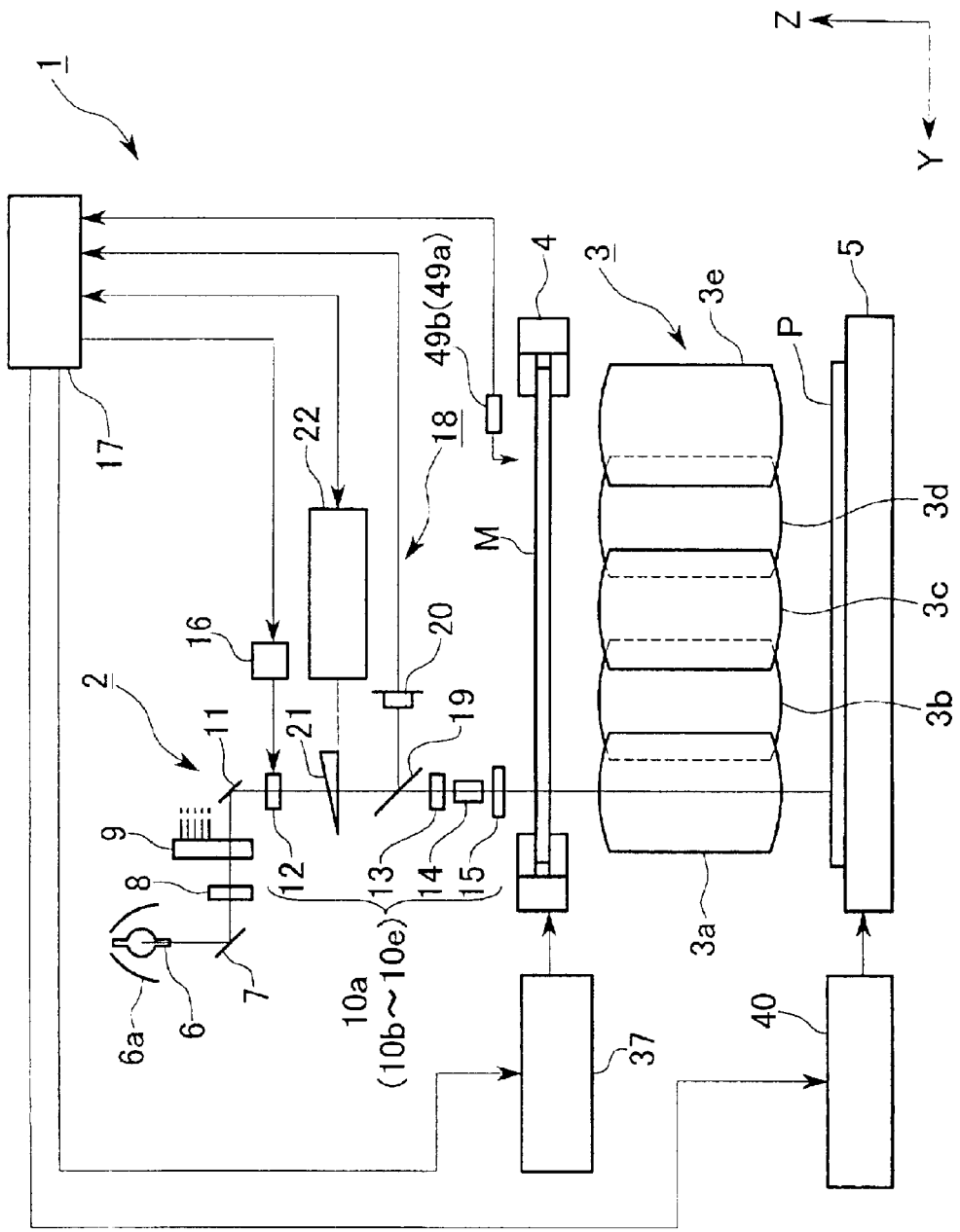
FIG. 2 is a constitutional view schematically showing the scanning exposure system of FIG. 1.

As shown in FIG. 2, the illumination optical system 2 is designed to illuminate the mask M with a luminous flux (exposure light) emitted from a light source 6 such as an extra-high pressure mercury lamp or the like. The illumination optical system 2 includes a dichroic mirror 7, a wavelength selection filter 8, a light guide 9, and illumination system modules 10a to 10e (in FIG. 2, only one corresponding to the illumination optical system 10a is shown for convenience) respectively arranged corresponding to the projection system modules 3a to 3e.

The luminous flux emitted from the light source 6 is converged by an elliptic mirror 6a, and then made incident on the dichroic mirror 7. The dichroic mirror 7 is chosen to reflect a luminous flux having the wavelength necessary for exposure, and transmit luminous fluxes having other wavelengths. The luminous flux reflected by the dichroic mirror 7 is made incident on the wavelength selection filter 8, and becomes a luminous flux having a wavelength (normally, a band of at least one among g, h and i lines) suited for exposure by the projection optical system 3, and is then made incident on the light guide 9. The light guide 9 branches the incident luminous flux into five fluxes, which are made incident through a reflecting mirror 11 on the illumination system modules 10a to 10e.

Each of the illumination system modules 10a to 10e includes, in its schematic constitution, an illumination shutter (light shielding device) 12, a relay lens 13, a fly-eye lens 14, and a condenser lens 15. In the described embodiment, the illumination system modules 10b to 10e having the same constitution as the illumination system module 10a are arranged at specified intervals in the X and Y directions. Luminous fluxes from the respective illumination system modules 10a to 10e are used to illuminate different illumination regions on the mask M.

The illumination shutter 12 is arranged behind the light guide 9 so as to be freely movable forwards and backwards with respect to the optical path of a luminous flux. The illumination shutter 12 blocks a luminous flux going from the optical path to the mask M and the glass substrate P when the optical path is closed, releases the blocking of the luminous flux when the optical path is opened, and thereby illuminates the mask M and the glass substrate P with the luminous flux. In addition, the illumination shutter 12 is provided by a shutter driving unit 16 for moving the illumination shutter 12 forwards and backwards with respect to the optical path. The driving of the shutter driving unit 16 is controlled by a control unit 17.

A light amount adjusting mechanism 18 is added for each of the illumination system modules 10a to 10e. The light amount adjusting mechanism 18 adjusts the amount of exposure for each optical path by setting illuminance of a luminance flux for each optical path, and includes a half mirror 19, a detector 20, a filter 21 and a filter driving unit 22. The half mirror 19 is arranged in an optical path between the filter 21 and the relay lens 13, and makes a part of a luminous flux transmitted through the filter 21 incident on the detector 20. The detector 20 detects the illuminance of the incident luminous flux, and outputs a detected illuminance signal to the control unit 17.

The filter 21 is formed by patterning Cr or the like on a glass plate to form a plurality of parallel lines such that a transmittance can be gradually changed linearly within a certain range along the Y direction. This filter 21 is arranged between the illumination shutter 12 and the half mirror 19 in each optical path. The half mirror 19, the detector 20 and the filter 21 are provided for each of a plurality of optical paths. The filter driving unit 22 moves the filter 21 along the Y direction based on instructions from the control unit 17.

Thus, the control unit 17 controls the filter driving unit 22 based on the illuminance of the luminous flux detected by the detector 20. In this way, the light amount can be adjusted for each optical path such that the illuminance on the glass substrate P can have a predetermined value for each optical path.

The luminous flux passing through the light amount adjusting mechanism 18 is transmitted through the relay lens 13 to reach the fly-eye lens 14. A secondary light source is formed in the emission surface side of the fly-eye lens 14, and the illumination region of the mask M can be illuminated with uniform illuminance by the condenser lens 15.

The luminous flux passing through the mask M is made incident on each of the projection system modules 3a to 3e.

Figure 3:
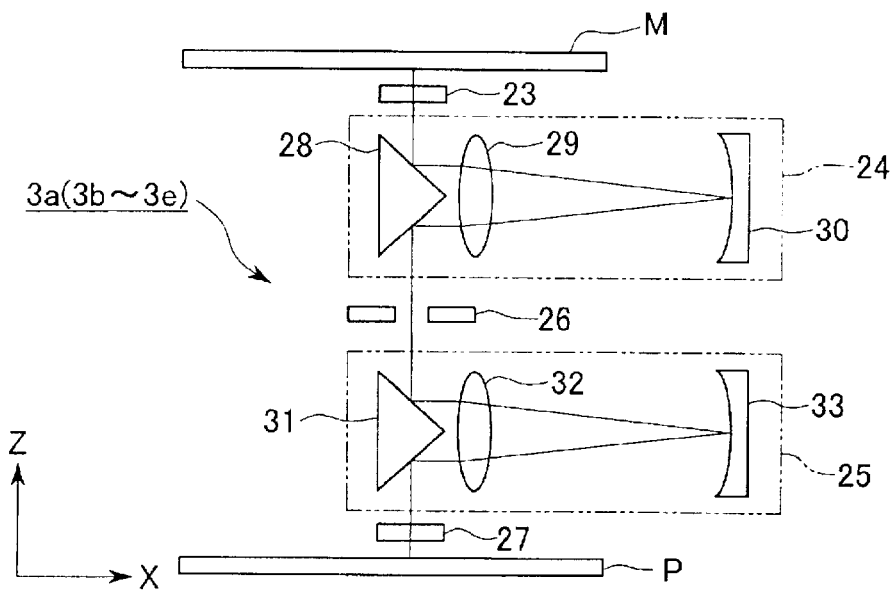
FIG. 3 is a constitutional view schematically showing a projection system module constituting the scanning exposure system of the invention.

The pattern of the mask M of the illumination region is transferred onto the glass substrate P coated with resist based on a predetermined image-forming characteristic. As shown in FIG. 3, each of the projection system modules 3a to 3e includes an image shifting mechanism 23, two reflection refractive optical systems 24 and 25, a field diaphragm 26, and a magnification adjusting mechanism 27.

The luminous flux passing through the mask M is made incident on the image shifting mechanism 23. The image shifting mechanism 23 shifts the pattern image of the mask M in the X or Y direction by, for example, rotating each of two parallel flat plate glasses around the Y or X axis. The luminous flux passed through the image shifting mechanism 23 is made incident on the first reflection refractive optical system 24. The reflection refractive optical system 24 forms an intermediate image of the pattern of the mask M, and includes a rectangular prism 28, a lens 29, and a concave mirror 30. The rectangular prism 28 is freely rotatable around a Z axis, and rotates the pattern image of the mask M.

The field diaphragm 26 is arranged at the position of the intermediate image. The field diaphragm 26 sets a trapezoidal projection region on the glass substrate P. The luminous flux passing through the field diaphragm 26 is made incident on the second reflection refractive optical system 25. As in the case of the reflection refractive optical system 24, the reflection refractive optical system 25 is provided with a rectangular prism 31, a lens 32 and a concave mirror 33. The rectangular prism 31 is freely rotatable around the Z axis, and rotates the pattern image of the mask M.

The luminous flux emitted from the reflection refractive optical system 25 is passed through the magnification adjusting mechanism 27, and forms an unmagnified erect pattern image of the mask M on the glass substrate P. The magnification adjusting mechanism 27 includes three lenses, for example, a planoconvex lens, a biconvex lens, and planoconcave lens. By moving the biconvex lens located between the planoconvex lens and the planoconcave lens in the direction of the Z axis, the magnification of the pattern image of the mask M is changed.

Figure 4:
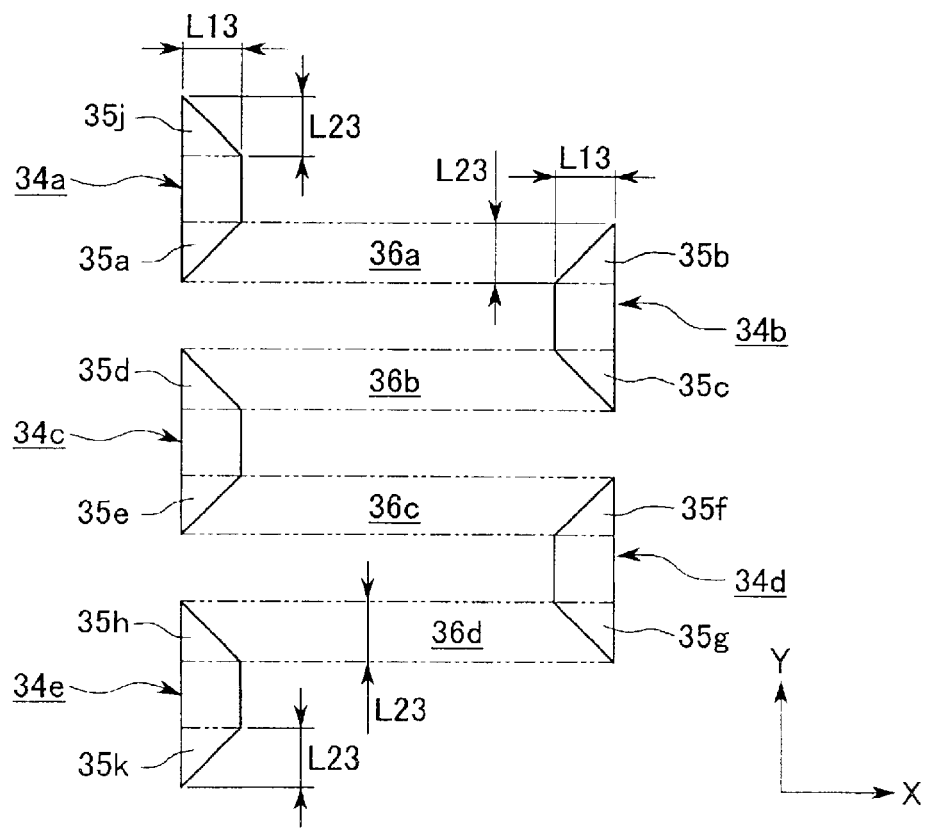
FIG. 4 is a plan view showing a projection region set by the projection system module according to the first embodiment of the invention.

FIG. 4 is a plan view showing the projection regions (image field) 34a to 34e of the projection system modules 3a to 3e on the glass substrate P. As shown in the figure, each of the projection regions 34a to 34e is formed in a trapezoidal shape, and the projection regions 34a, 34c and 34e and the projection regions 34b and 34d are arranged at intervals in the X direction while the short sides thereof are set to face each other. Further, the projections regions 34a to 34e are arranged in parallel such that the ends of adjacent projection regions (35a and 35b, 35c and 35d, 35e and 35f, and 35g and 35h) can be overlapped in the Y direction as shown by double dotted chain lines, and the sum of widths of the projection regions in the X direction can be substantially equal. In other words, the projection regions 34a to 34e are set so that the exposure amounts can be equal when scanning exposure is carried out in the X direction.

Thus, by providing overlapped joining portions 36a to 36d in the projection regions 34a to 34e of the projection system modules 3a to 3e, changes in optical aberration and illuminance in the joining portions 36a to 36d can be made smooth. Each of the projections regions 34a to 34e of the embodiment is formed to be trapezoidal; however, their shape may be hexagonal, trapezoidal, parallelogram shaped, or the like.

The mask stage 4 holds the mask M, and has a long stroke in the X direction for one-dimensional scanning exposure, and a very small amount of stroke, that is, several mm, in the Y direction orthogonal to the scanning direction. As shown in FIG. 2, the mask stage 4 is provided with a mask stage driving unit 37 for driving the mask stage 4 in the X and Y directions. The mask stage driving unit 37 is controlled by the control unit 17.

As shown in FIG. 1, moving mirrors 38a and 38b are installed in an orthogonal direction in edges of the mask stage 4. A laser interferometer 39a is arranged facing the moving mirror 38a. A laser interferometer 39b is arranged facing the moving mirror 38b. The laser interferometers 39a and 39b emit laser beams to the moving mirrors 38a and 38b to measure each distance between the laser interferometers and the corresponding mirrors. Accordingly, the position of the mask stage 4 in the X or Y direction, thus, the position of the mask M, can be detected with high resolution and high accuracy. Though not shown in the figures, the detection results of the laser interferometers 39a and 39b are output to the control unit 17.

The substrate stage 5 holds the glass substrate P. As in the case of the mask stage 4, the substrate stage 5 has a long stroke in the X direction for one-dimensional scanning exposure, and a long stroke for a step movement in the Y direction orthogonal to the scanning direction. Also, the substrate stage 5 is provided with a substrate stage driving unit 40 for driving the substrate stage 5 in the X and Y directions. The substrate stage driving unit 40 is controlled by the control unit 17. Further, the substrate stage 5 is also freely movable in the Z direction. The substrate stage 5 is provided with measuring means (not shown) for measuring the positions of the pattern surface of the mask M and the exposure surface of the glass substrate P in the Z direction, and control is performed such that a predetermined interval can always be set between the pattern surface of the mask M and the exposure surface of the glass substrate P.

Moving mirrors 42a and 42b are installed in an orthogonal direction at the edges of the substrate stage 5. A laser interferometer 43a is arranged facing the moving mirror 42a. A laser interferometer 43b is arranged facing the moving mirror 42b. The laser interferometers 43a and 43b emit laser lights onto the moving mirrors 42a and 42b to measure the distance between the laser interferometers and the corresponding mirrors. Accordingly, the position of the substrate stage 5 in the X or Y direction, thus, the position of the glass substrate P, can be detected with high resolution and high accuracy. Though not shown in the figures, the detection results of the laser 1, interferometers 43a and 43b are output to the control unit 17.

The control unit 17 monitors the position of the mask stage 4 based on the outputs from the laser interferometers 39a and 39b, and moves the mask stage 4 to a desired position by controlling the mask stage driving unit 37. The control unit 17 also monitors the position of the substrate stage 5 based on the outputs from the laser interferometers 43a and 43b, and moves the substrate stage 5 to a desired position by controlling the substrate stage driving unit 40. In other words, the control unit 17 controls both driving units 37 and 40 while monitoring the positions of the mask and substrate stages 4 and 5, and thereby moves the mask M and the glass plate P in synchronization in the X direction at a certain optional scanning speed (synchronous moving speed) with respect to the projection system modules 3a to 3e.

Next, a description will be given of the mask M and the glass substrate P used for the scanning exposure method and the scanning exposure system of the embodiment.

As shown in FIG. 5, a rectangular LCD pattern LP formed by picture-synthesizing of four divided patterns 51 to 54 is transferred to the glass substrate P. Though not shown, the LCD pattern LP is composed of a pixel pattern and a peripheral circuit pattern which is located at the periphery of the pixel pattern. The pixel pattern includes a plurality of electrodes arrayed in order and repeatedly corresponding to a plurality of pixels. The peripheral circuit pattern includes driver circuits or the like arrayed repeatedly for driving the electrodes of the pixel pattern.

As shown in FIG. 6(a), a divided pattern 51 has a rectangular shape, the length thereof in the X direction being denoted by L11, and the length thereof in the Y direction by L21. In the −X side region of the divided pattern S1, the overlapping part 5a with a width L13 exposed while partially overlapped with a divided pattern 52 adjacent in the scanning direction is set as a belt-like region, extending in the Y direction. In the −Y side region of the divided pattern 51, the overlapping part 51b of a width L23 exposed while partially overlapped with a divided pattern 54 adjacent in a non-scanning direction is set as a belt-like region, extending in the X direction. Further, the region of a roughly square shape intersected by the overlapping parts 51a and 51b is set as an overlapping part 51c to be exposed quadruply when the divided patterns 51 to 54 are exposed.

Likewise, as shown in FIG. 6(b), in the +X side region of the divided pattern 52, the length thereof in the X direction being denoted by L12, and the length thereof in the Y direction by L21, an overlapping part 52a is set to be exposed partially overlapping the divided pattern 51. In the −Y side region of the divided pattern 52, an overlapping part 52b is set to be exposed partially overlapping the divided pattern 53. Further, in the region intersected by the overlapping parts 52a and 52b, an overlapping part 52c is set to be quadruply exposed. As shown in FIG. 6(c), in the +X side region of the divided pattern 53, the length thereof in the X direction being denoted by L12, and the length thereof in the Y direction by L22, the overlapping part 53a is set to be exposed partially overlapping the divided pattern 54. In the +Y side region of the divided pattern 53, the overlapping part 53b is set to be exposed partially overlapping the divided pattern 52. Further, in the region intersected by the overlapping parts 53a and 53b, an overlapping part 53c is set to be quadruply exposed. Likewise, as shown in FIG. 6(d), in the −X side region of the divided pattern 54, the length thereof in the X direction being denoted by L11, and the length thereof in the Y direction by L22, an overlapping part 54a is set to be exposed partially overlappingly with the divided pattern 53. In the +Y side region of the divided pattern 54, an overlapping part 54b is set to be exposed partially overlapping the divided pattern 51. Further, in the region intersected by the overlapping parts 54a and 54b, an overlapping part 54c is set to be quadruply exposed.

The width L23 of each of the overlapping parts 51b to 54b is set equal to the width in the Y direction of each of the triangular ends 35a to 35h, 35j and 35k of the projection regions (illumination region) 34a to 34e shown in FIG. 4. The width L13 of each of the overlapping parts 51a to 54a is set equal to that in the width of each of the projection regions 34a to 34e in X direction.

Figure 7:
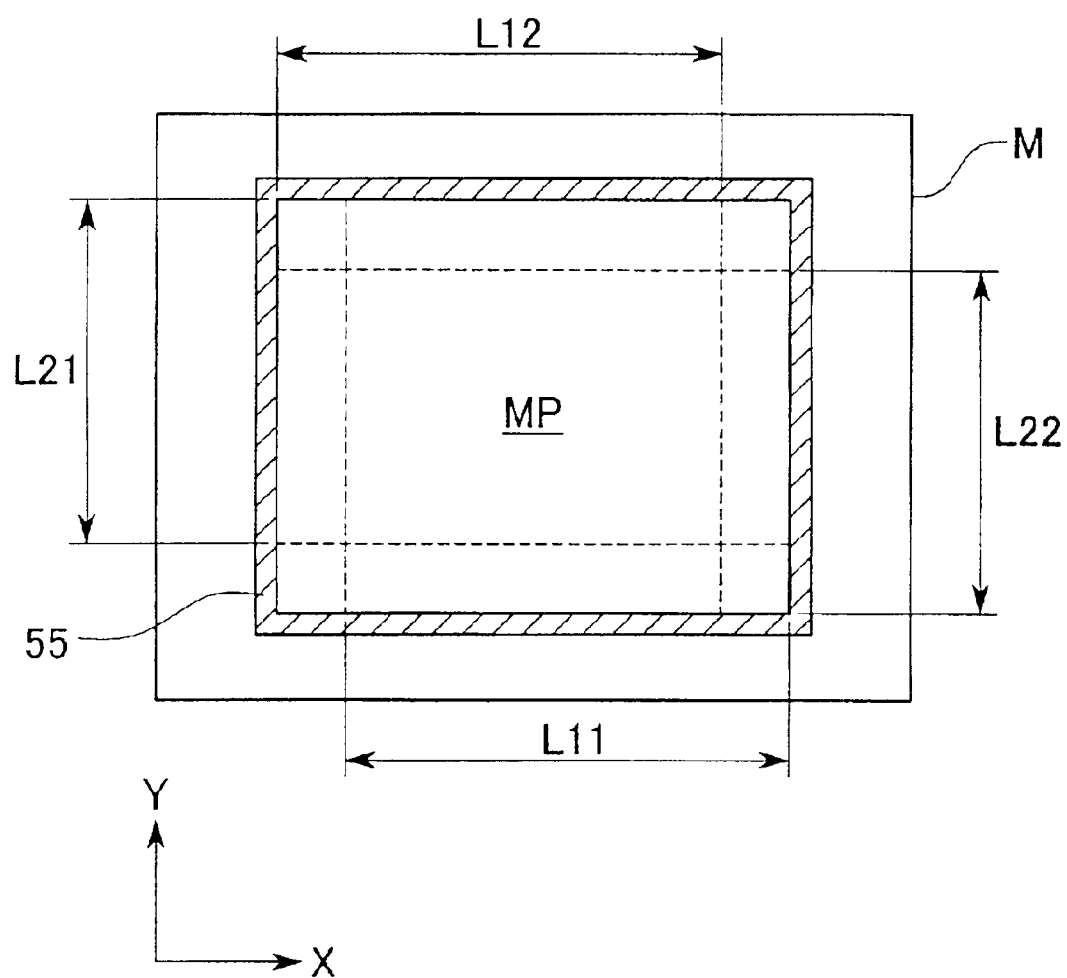
FIG. 7 is a plan view showing a mask used for scanning exposure according to the first embodiment of the invention.

As shown in FIG. 7, the mask M includes a pattern MP formed to select each of the divided patterns 51 to 54 by partially setting an illumination region based on the characteristics of the pixel pattern and the peripheral circuit pattern being composed of repeated patterns. Specifically, the divided pattern 51 is selected by setting the pattern MP to have lengths L11 and L21 respectively in the X and Y directions; and the divided pattern 52 is selected by setting the pattern MP to have lengths L12 and L21 respectively in the X and Y-directions. Similarly, the divided pattern 53 is selected by setting the pattern MP to have lengths L12 and L22 respectively in the X and Y directions; and the divided pattern 54 is selected by setting the pattern MP to have lengths L11 and L22 respectively in the X and Y directions.

A light shielding band 55 made of Cr is formed around the pattern MP of the mask M. The light shielding band 55 forms edges in the divided patterns in the sides opposite the overlapping parts 51a to 54b, and 51b to 54b by shielding the projection regions in the sides opposite the overlapping parts 51a to 54a, and 51b to 54b when the divided patterns 51 to 54 are scanned and exposed.

In the upper side of the mask M, alignment systems 49a and 49b are arranged to detect a mask alignment mark (not shown) formed in the mask M, and a substrate alignment mark (not shown) formed in the glass substrate P. The alignment systems 49a and 49b irradiate the mask alignment mark with a detecting light, and measures the amount of positional deviation between the mask M, and the glass substrate P by receiving the reflected light of the mask alignment mark, and the reflected light of the A substrate alignment mark obtained through the mask alignment mark and the outside projection system module 3a or 3e. As shown in FIG. 2, the measurement results of the alignment systems 49a and 49b are output to the control unit 17. Each of the alignment systems 49a and 49b has a driving mechanism (not shown) for movement in the X direction, and can move away from the inside of the illumination region during scanning exposure.

Now, a description will be given of the process of joining and exposing the divided patterns 51 to 54 on the glass substrate P, and then picture-synthesizing the LCD pattern LP, which is carried out by the scanning exposure system 1 constructed in the foregoing manner. It is assumed herein that scanning exposure is carried out in the order of divided patterns 51, 52, 53 and 54. In the description, the movements of the mask and substrate stages 4 and 5, and the driving of the illumination shutter 12 in each of the illumination system modules 10a to 10b is carried out through the mask and substrate stage driving units 37 and 40, and the shutter driving unit 16. The driving of each is carried out based on the control of the control unit 1 for controlling each driving unit.

First, in the alignment systems 49a and 49b, mask and substrate alignment marks are measured, and the amount of positional deviation between the mask M and the glass substrate P is obtained. Based on the result of this measurement, the mask stage 4 or the substrate stage 5 is finely moved for alignment. Simultaneously, calculation of the amounts of correction for relative shifting, rotation and scaling of each of the projection system modules 3a to 3e with respect to the mask M and the glass substrate P is made. Then, based on the calculated amounts of correction, the image shifting mechanism 23, the magnification adjusting mechanism 27 and the rectangular prisms 28 and 31 for image rotation of each of the projection system modules 3a to 3e are corrected.

Then, by driving the mask and substrate stages 4 and 5, the mask M and the glass substrate P are moved to the scanning start position of the divided pattern 51 (position of the exposure region of the divided pattern 51 located in the +X side of the projection regions 34a to 34e). In this case, the scanning direction of the mask M and the glass substrate P is set in the −X direction. At this time, as shown in FIG.

Figure 8A:
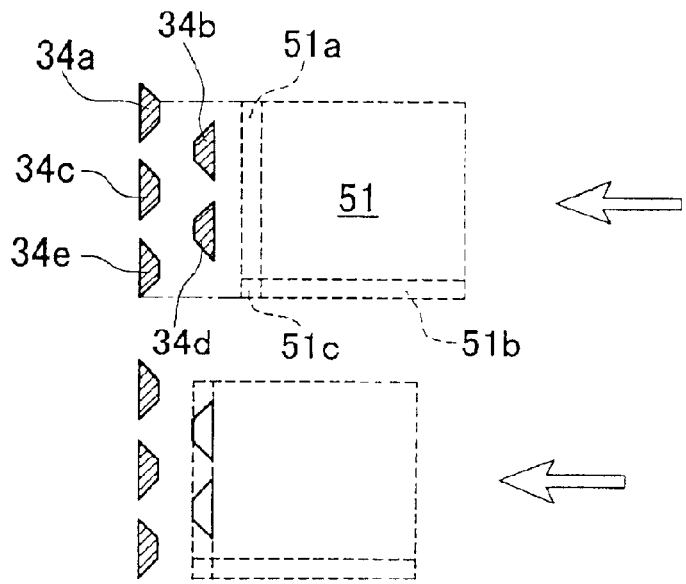
FIG. 8(*a*) is a plan view illustrating a process for scanning and exposing a divided pattern, specifically showing a case where the divided pattern is in the starting position of scanning exposure.

5, the mask and substrate stages 4 and 5 are driven so that the lower end 35k of the projection region 34e can coincide with the position of the overlapping part 51b in the Y direction. As shown in FIG. 8(a), the projection regions 34a to 34c are shielded by blocking the optical path of a luminous flux with the illumination shutter 12.

Figure 8B:
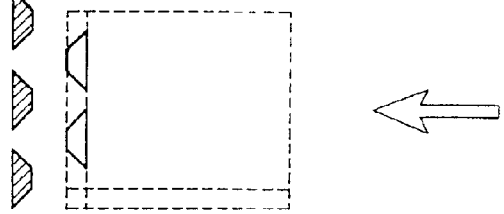

After the start of scanning, the mask M and the glass substrate P are moved in synchronization in the −X direction at a constant speed. Then, as shown in FIG. 8(b), when the exposure region of the overlapping part 51a is positioned in the projection regions 34b and 34d, in the illumination system modules 3b and 3d corresponding to the projection regions 34b and 34d, the illumination shutter 12 is driven to open the optical path of a luminous flux. Accordingly, the exposure of the divided pattern 51 located in the projection regions 34b and 34d is started. The driving timing or the like for the illumination shutter 12 is set based on the position measurement results of the mask and substrate stages 4 and 5 by the laser interferometers 39a and 39b, and 43a and 43b (the process is similar thereafter).

Figure 8C:
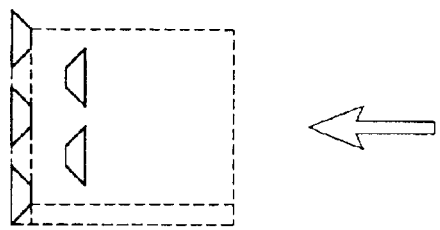
Figure 8D:
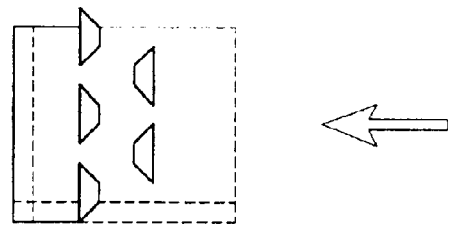
Figure 8E:
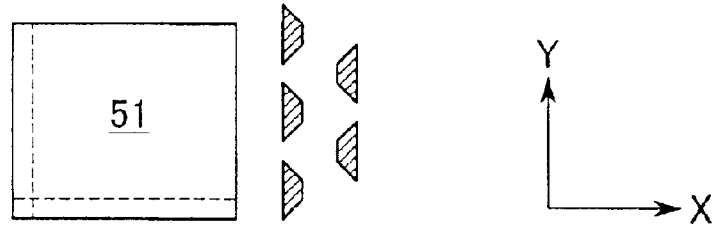

The synchronous movement advances, and as shown in FIG. 8(c), when the exposure region of the overlapping part 51a is positioned in the projection regions 34a, 34c and 34e after the projection regions 34b and 34d, also in the illumination system modules 3a, 3c and 3e corresponding to the projection regions 34a, 34c and 34e, the illumination shutter 12 is driven to open the optical path of a luminous flux. As a result, the exposure of the divided pattern 51 located in the projection regions 34a, 34c and 34e is also started and, as shown in FIG. 8(d), exposure is carried out in all the projection regions 34a to 34e. Then, when the projection regions 34a to 34e are shifted from the exposure region of the divided pattern 51, as shown in FIG. 8(e), the illumination shutter 12 of the projection regions 34a to 34e is closed, and the synchronous movement of the mask M and the glass substrate P is stopped. An edge in the +X side of the divided pattern 51 is formed by the light shielding band 55 of the mask M.

Subsequently, to expose the divided pattern 52, first, by driving the mask and substrate stages 4 and 5 in the +X direction, the mask M and the glass substrate P are moved to the scanning start position of the divided pattern 52 (position of the exposure region of the divided pattern 52 located in the +X side of the projection regions 34a to 34e). Then, the mask M and the glass substrate P are moved in synchronization in the −X direction, and the illumination shutter 12 is opened before each of the projection regions 34a to 34e reaches the exposure region of the divided pattern 52. Accordingly, as shown in FIG. 9(a), the portions of the divided pattern 52 located in the projection regions 34a to 34e are sequentially exposed. An edge in the −X side of the divided pattern 52 is also formed by the light shielding band 55 of the mask M.

The scanning exposure advances and, as shown in FIG. 9(b), when the exposure region of the overlapping part 52a is positioned in the projection regions 34b and 34d, the illumination shutter 12 corresponding to the projection regions 34b and 34d is closed to block the luminous flux. Then, as shown in FIG. 9(c), scanning exposure is carried out while the illumination shutter 12 corresponding to the projection regions 34a, 34c and 34e is kept open. Then, as shown in FIG. 9(d), when the exposure region of the overlapping part 52a is positioned in the projection regions 34a, 34c and 34e, the illumination shutter 12 corresponding to the projection regions 34a, 34c and 34e is also closed. Subsequently, as shown in FIG. 9(e), when the projection regions 34a to 34 are shifted from the exposure region of the divided pattern 52, the synchronous movement of the mask M and the glass substrate P is stopped, and the scanning exposure of the divided pattern 52 is finished.

Then, to expose the divided pattern 53, by driving the mask stage 4 in the +X direction and the substrate stage 5 is in the +X and +Y direction, the mask M and the glass substrate P are moved to the scanning start position of the divided pattern 53 (position of the exposure region of the divided pattern 53 located in the +X side of the projection regions 34a to 34e). In this case, as shown in FIG. 5, the mask and the substrate stages 4 and 5 are driven so that the upper end 35j of the projection region 34a can be positioned in the overlapping part 53b. Then, the mask M and the glass substrate P are moved in synchronization in the −X direction, and illumination shutter 12 is driven by the same process as that for the divided pattern 52 to expose the divided pattern 53.

Likewise, to expose the divided pattern 54, first, by driving the mask and substrate stages 4 and 5 in the +X direction, the mask M and the glass substrate P are moved to the scanning start position of the divided pattern 54 (position of the exposure region of the divided pattern 54 located in the +X side of the projection regions 34a to 34e). Then, the mask M and the glass substrate P are moved in synchronization in the −X direction, and the illumination shutter 12 is driven by the same process as that for the divided pattern 51 to expose the divided pattern 54. Specifically, exposure is carried out by driving the illumination shutter 12 in association with the driving of the mask and substrate stages 4 and 5. By the foregoing scanning exposure, an LCD pattern LP is formed on the glass substrate P, where the divided patterns 51 to 54 are picture-synthesized by overlapping the overlapping parts 51a to 54a and 51b to 54b of the adjacent patterns.

Next, the distribution of an exposure amount among the divided patterns 51 to 54 exposed in the foregoing manner will be investigated. Herein, it is assumed that normalization is made to set the overlapping part in the range of $0 \leq x \leq 1$, and $0 \leq y \leq 1$. Also, it is assumed that the exposure amount in this range is denoted by z, and the exposure amount is 1 in a non-overlapping part.

First, a description will be given of the distribution of an exposure amount in the overlapping parts 51c to 54c quadruply exposed in the divided patterns 51 to 54. During the exposure of the divided pattern 51, the overlapping part 51c is exposed by the end 35k of the projection region 34e. The distribution of an exposure amount in this case becomes a quadrangular pyramid like that shown in FIG. 10(a), and represented by the following function:

where $y \geq x$, $z = x$ where $y < x$, $z = y$ (1)

The overlapping part 52c is exposed by the end 35k of the projection region 34e during the exposure of the divided pattern 52. In this case, the distribution of an exposure amount becomes a triangular pyramid like that shown in FIG. 10(b), and represented by the following function:

where $y \geq xx$, $z = -x + y$ where $y < x$, $z = 0$ (2)

The overlapping part 53c is exposed by the end 35j of the projection region 34a during the exposure of the divided pattern 53. The distribution of an exposure amount in this case becomes a triangular pyramid like that shown in FIG. 10(c), and represented by the following function:

where $y \geq 1-x$, $z=0$ where $y < 1-x$, $z=1-x-y$ (3)

The overlapping part 54c is exposed by the end 35j of the projection region 34a during the exposure of the divided pattern 54. The distribution of an exposure amount in this case becomes a quadrangular pyramid like that shown in FIG. 10(d), and represented by the following function:

where $y \geq 1-x$, $z=1-y$ where $y < 1-x$, $z=x$ (4)

The sum of the above functions (1) to (4) becomes an exposure amount distribution after quadruple exposure, that is z=1. Specifically, the total amount of exposure for the exposure regions on the glass substrate P, which are quadruply exposed, is equal to that of the non-overlapping part. In other words, regardless of the physical structure or driving method, by forming the distributions of exposure amounts represented by the functions (1) to (4), the exposure amount portion of the quadruply exposed part can be set equal to that of the non-overlapping part.

Figure 11:
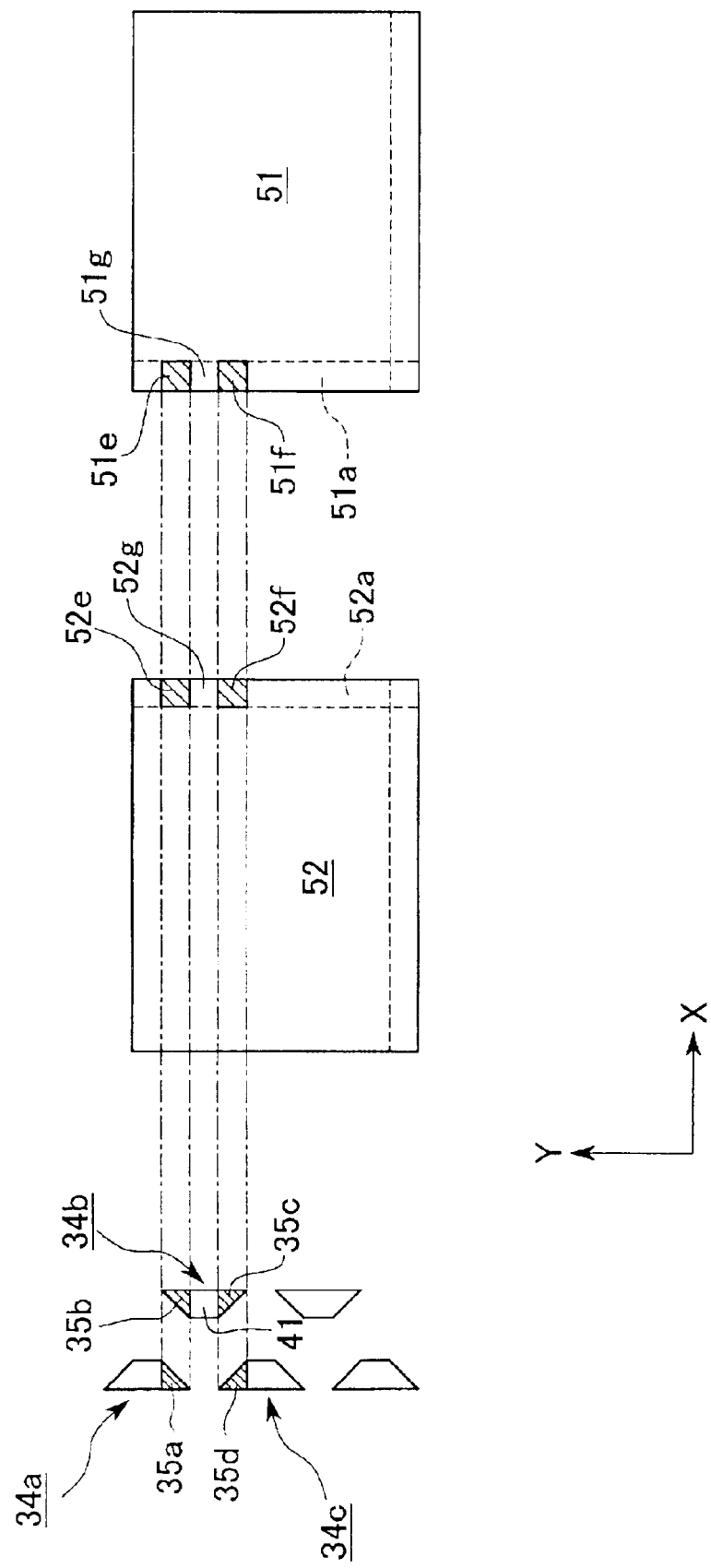
FIG. 11 is a plan view showing the positional relationship between the projection region and an overlapped part of a divided pattern.

Next, a description will be given of the overlapping parts 51a to 54a, where the divided patterns 51 and 52, and 53 and 54 adjacent in the X direction as the scanning direction overlap with each other. Since the distribution of an exposure amount of the overlapping parts 53a and 54a is equal to that of the overlapping parts 51a and 52a, the overlapping parts 51a and 52a will be described. Hereinbelow, as shown in FIG. 11, an explanation is given of the distributions of exposure amounts for the rectangular overlapping parts 51c and 52e which are exposed by the ends 35a to 35d of the projection regions 34a to 34c, the ends 35a and 35b, and rectangular overlapping parts 51f and 52f which are exposed by the ends 35c and 35d.

First, the overlapping part 51c in the overlapping part 51a is exposed by the end 35a of the projection region 34a during the exposure of the divided pattern 51 with the distribution of an exposure amount in this case being a quadrangular pyramid like that shown in FIG. 12(a). The overlapping part 51e is also exposed by the end 35b of the projection region 34b with the distribution of the exposure amount in this case being a triangular pyramid like that shown in FIG. 12(b). The distribution of the exposure amount in the case of exposure by the end 35a is represented by the foregoing function (1). The distribution of an exposure amount in the case of exposure by the end 35b is represented by the following function:

where $y \geq x$, $z=0$ where $y < x$, $z=x-y$ (5)

Figure 13A:
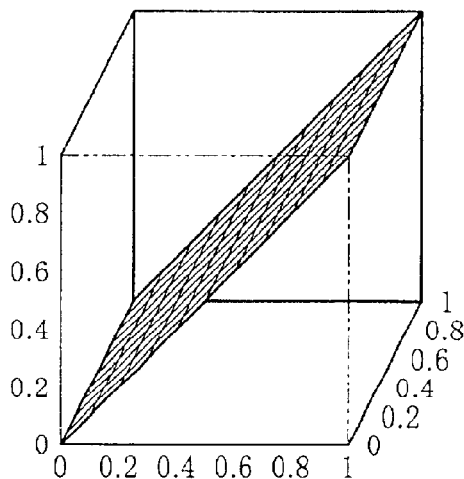
FIGS. 13(*a*) and 13(*b*) are views, each showing an exposure amount distribution of two overlapping parts exposed at the end of the projection region.

Thus, the exposure amount distribution of the overlapping part 5le exposed by the ends 35a and 35b during the exposure of the divided pattern 51 is, as shown in FIG. 13(a), represented by the function z=x which is the sum of the functions (1) and (5).

Similarly, during the exposure of the divided pattern 51, the overlapping part 51f is exposed by the end 35d of the projection region 34c with the distribution of an exposure amount in this case being a quadrangular pyramid like that shown in FIG. 12(c). The overlapping part 51f is also exposed by the end 35c of the projection region 34b with the distribution of an exposure amount in this case being a triangular pyramid like that shown in FIG. 12(d). The distribution of an exposure amount in the case of exposure by the end 35d is represented by the foregoing function (4). The distribution of an exposure amount in the case of exposure by the end 35c is represented by the following function:

where $y \geq 1-x$, $z=x+y-$ where $y < 1-x$, $z=0$ (6)

Thus, the exposure amount distribution of the overlapping part 51f exposed by the ends 35d and 35c during the exposure of the divided pattern 51 is, as shown in FIG. 13(a), represented by the function z=x which is the sum of the functions (4) and (6).

On the other hand, regarding the overlapping part exposed by a rectangular part excluding the end in each projection region, for example, as shown in FIG. 11, an overlapping part 51g held between the overlapping parts 51e and 51f in the overlapping part 51a is exposed by the rectangular center part 41 of the projection region 34b with the distribution of an exposure amount in this case being z=x shown in FIG. 13(a). The same applies to the overlapping parts exposed by the rectangular parts of the other projection regions 34a, and 34c to 34e. As a result, the overlapping part 51a in the divided pattern 51 is exposed with the distribution of an exposure amount having a gentle gradient represented by the function z=x like that shown in FIG. 14(a). Then, the overlapping part 52e in the overlapping part 52a is exposed by the end 35a of the projection region 34a during the exposure of the divided pattern 52 with the distribution of an exposure amount in this case being a triangular pyramid like that shown in FIG. 15(a). The overlapping part 52e is also exposed by the end 35b of the projection region 34b with the distribution of an exposure amount in this case being a quadrangular pyramid in shape like that shown in FIG. 15(b). The exposure amount distribution in the case of exposure by the end 35a is represented by the foregoing function (2), while the exposure amount distribution in the case of exposure by the end 35b is represented by the following function:

where $y \geq x$, $z=1-y$ where $y < x$, $z=0$ (7)

Figure 13B:
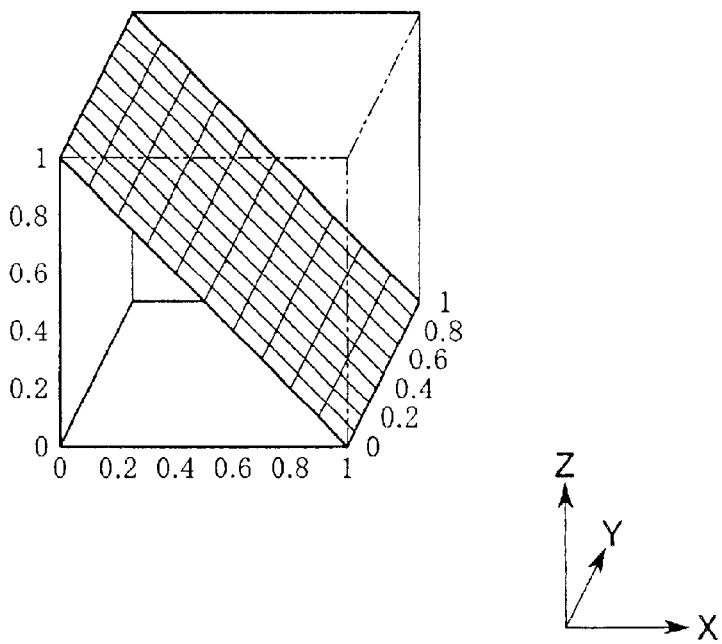

Thus, the exposure amount distribution of the overlapping part 52e exposed by the ends 35a and 35b during the exposure of the divided pattern 52 is, as shown in FIG. 13(b), represented by the function z=1-x which is the sum of the functions (2) and (7).

Similarly, the overlapping part 52f is exposed by the end 35d of the projection region 34c during the exposure of the divided pattern 52 with the distribution of an exposure amount in this case being a triangular pyramid like that shown in FIG. 15(c). The overlapping part 52f is also exposed by the end 35c of the projection region 34b with the distribution of an exposure amount in this case being a quadrangular pyramid like that shown in FIG. 15(d). The exposure amount distribution in the case of exposure by the end 35d is represented by the foregoing function (3), while the exposure amount distribution in the case of exposure by the end 35c is represented by the following function:

where $y \geq 1-x$, $z=1-x$ where $y < 1-x$, $z=y$ (8)

Thus, the exposure amount distribution of the overlapping part 52f exposed by the ends 35d and 35c during the exposure of the divided pattern 52 is, as shown in FIG. 13(b), represented by the function z=1-x which is the sum of the functions (3) and (8). Also, the overlapping part 52g held between the overlapping parts 52e and 52f in the overlapping part 52a as shown in FIG. 11 is exposed by the center part 41 with the distribution of an exposure amount in this case being represented by z=1-x shown in FIG. 13(b). The same applies to the overlapping parts exposed by the rectangular parts of the other projection regions 34a, and 34c to 34e. As a result, the overlapping part 52a in the divided pattern 52 is exposed with the distribution of an exposure amount having a gentle gradient represented by z=1-x like that shown in FIG. 14(b).

Accordingly, by exposing the adjacent divided patterns 51 and 52 along the synchronous moving direction, the total amount of exposure in the exposure region of the overlapping parts 51a and 52a becomes z=1, equal to that of the non-overlapping part. The same holds true for the overlapping parts 53a and 54a, where the divided patterns 53 and 54 overlap each other.

Next, a description will be given of the overlapping parts 51b to 54b, where the divided patterns 51 and 54, and 52 and 53 adjacent in the Y direction as a non-scanning direction overlap each other. In this case, the overlapping parts 51b and 52b are exposed by the end 35k of the projection region 34e. Since the end 35k is gradually reduced in diameter in the -Y direction, exposure is carried out with the distribution of an exposure amount represented by the function z=y as shown in FIG. 14(c). Similarly, the overlapping parts 53b and 54b are exposed by the end 35j of the projection region 34a. Since the end 35j is gradually reduced in diameter in the +Y direction, exposure is carried out with the distribution of an exposure amount represented by the function z=1-y as shown in FIG. 14(d).

Thus, by exposing the divided patterns 51 to 54, z=1 is set for the total exposure amount of the projection region, where the overlapping parts 51b and 54b, and 52b and 53b overlap each other. Accordingly, even when the divided patterns 51 to 54 are partially overlapped and joined in the X and Y directions, exposure can be carried out with the uniform exposure amount distribution of z=1.

As apparent from the foregoing, in the scanning exposure method and the scanning exposure system of the embodiment, since the divided patterns are partially overlapped with each other with a smooth exposure amount distribution even in the synchronous moving direction of the mask M and the glass substrate P, the divided patterns can be smoothly joined, making it possible to easily deal with the enlargement of a liquid crystal display panel without reducing its quality. Especially, according to the embodiment, the projection optical system 3 includes the plurality of projection system modules 3a to 3e, where the projection regions overlap in the Y direction. Accordingly, even in the non-scanning direction, a longer liquid crystal display panel can be manufactured, making it possible to obtain a larger-area panel. Moreover, according to the embodiment, since the amount of exposure in the overlapping parts of the divided patterns is controlled by a simple operation, that is, switching between irradiation and shielding of an exposure light, it is possible to prevent increases in the size of the system and costs.

Figure 16:
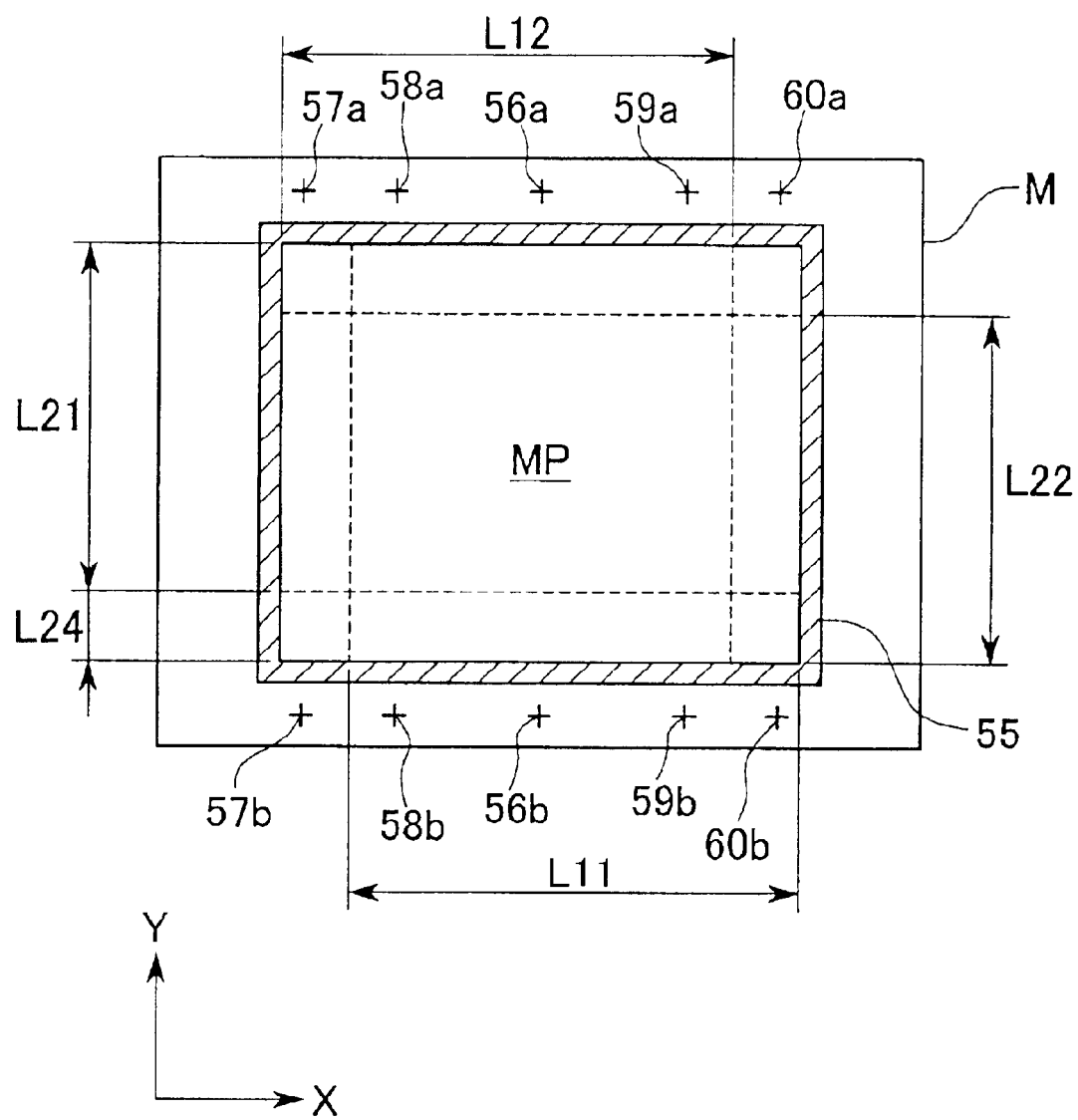
FIG. 16 is a plan view showing a mask used for scanning exposure according to a second embodiment of the invention.

Each of FIGS. 16 and 17 illustrates a scanning exposure method and a scanning exposure system according to a second embodiment of the invention. In the drawings, the same elements as those of the first embodiment shown in FIGS. 1 to 15 are shown with the same reference numerals, and description thereof will be omitted. The second embodiment is different from the first embodiment in that the driving timing of the illumination shutter 12 is not based on the position measurement result of the mask and substrate stages 4 and 5, but measured by detecting a joining mark, and the order of exposing divided patterns 51 to 54 is optimized.

As shown in FIG. 16, outside of the light shielding band 55 of the mask M, alignment marks 56a and 56b are positioned near the center of both side edges (that is, center of both end sides of the mask M in the Y direction) along the X direction, and alignment marks 57a to 60a, and 57b to 60b are positioned on a straight line along the X direction in both side edges. The alignment marks 56a and 56b are used for pre-alignment of the mask M, and the alignment marks 57a to 60a, and 57b to 60b are used for calculation of various correction amounts during the alignment of the mask M. These marks are made of Cr or the like, and formed in cross shapes.

The alignment marks 57a to 60a, and 57b to 60b are also used as indexes for switching between the irradiation and the shielding of a luminous flux by the illumination shutter 12 when the overlapping parts 51a to 54a of the divided patterns 51 to 54 are positioned in the projection regions 34a to 34e. Specifically, among the projections regions 34a to 34e, the three projection regions 34a, 34c and 34e arrayed in the Y direction are set as a projection region group 34m, while the two projection regions 34b and 34d arrayed in the Y direction are set as a projection region group 34n. Then, the alignment mark 57a is formed in a position detected by the alignment system 49a when the overlapping part 51a is positioned in the projection region group 34n during the scanning exposure of the divided pattern 51. The alignment mark 58a is formed in a position detected by the alignment system 49a when the overlapping part 51a is positioned in the projection region group 34m. These alignment marks 57a and 58b are arranged near the divided pattern 51 exposed when each alignment mark is detected.

Likewise, the alignment mark 59a is formed in a position detected by the alignment system 49a when the overlapping part 52a is positioned in the projection region group 34n during the scanning exposure of the divided pattern 52. The alignment mark 60a is formed in a position detected by the alignment system 49a when the overlapping part 52a is positioned in the projection region group 34m. Furthermore, the alignment mark 57b is formed in a position detected by the alignment system 49b when the overlapping part 54a is positioned in the projection region group 34n during the scanning exposure of the divided pattern 54. The alignment mark 58b is formed in a position detected by the alignment system 49b when the overlapping part 54a is positioned in the projection region group 34m. Still furthermore, the alignment mark 59b is formed in a position detected by the alignment system 49b when the overlapping part 53a is positioned in the projection region group 34n during the scanning exposure of the divided pattern 53. The alignment mark 60b is formed in a position detected by the alignment system 49b when the overlapping part 53a is positioned in the projection region group 34m.

The alignment marks 59a, 60a, and 57b to 60b are also arranged near the divided pattern exposed when each alignment mark is detected.

To perform scanning exposure by using such a mask M, first, the alignment marks 56a and 56b are respectively measured by the alignment systems 49a and 49b to carry out pre-alignment. Then, the alignment marks 57a to 60a, and 57b to 60b are measured to calculate various correction amounts for correcting the image-forming characteristics.

Then, after the image-forming characteristics of each of the projection system modules 3a to 3e is adjusted, the divided pattern 51 is subjected to scanning exposure.

In this case, first, as shown in FIG. 17(a), the mask stage 4 and the substrate stage 5 are driven from a scanning start position, where the exposure region of the divided pattern 51 is located in the +X side of the projection region groups 34m and 34n, and the mask M and the glass substrate P are moved in the −X direction in synchronization. At this time, the optical path of the luminous flux is blocked by the illumination shutter 12. Then, when the alignment system 49a detects the alignment mark 57a, that is, when the overlapping part 51a is positioned in the projection region group 34n, the illumination shutter 12 corresponding to this projection region group 34n is immediately opened to open the optical path of the luminous flux.

The synchronous movement advances, and when the alignment system 49a detects the alignment mark 58a, that is, when the overlapping part 51a is positioned in the projection region group 34m, the illumination shutter 12 corresponding to this projection region group 34m is immediately opened to open the optical path of the luminous flux. Then, as shown in FIG. 17(b), when the exposure region of the divided pattern 51 reaches the −X side of the projection region groups 34m and 34n, the exposure of the divided pattern 51 is completed.

Subsequently, to expose the divided pattern 54, the mask M and the glass substrate P are moved stepwise in the +Y direction (the glass substrate P is moved by a length L22, while the mask M is moved only by a length L24 shown in FIG. 16). Accordingly, as shown in FIG. 17(c), the exposure region of the divided pattern 54 is positioned in the −X side of the projection region groups 34m and 34n. Then, while the optical path of the luminous flux is blocked by the illumination shutter 12, the mask M and the glass substrate P are moved in the +X direction in synchronization. Before the divided pattern 54 reaches each of the projection region groups 34m and 34n, the illumination shutter 12 corresponding to the projection region groups 34m and 34n is opened to release the optical path of the luminous flux. When the alignment system 49b detects the alignment mark 58b during the synchronous movement, the illumination shutter 12 corresponding to the projection region group 34m is immediately closed to block the optical path of the luminous flux.

Further, the synchronous movement advances and, when the alignment system 49b detects the alignment mark 57b, the illumination shutter 12 corresponding to the projection region group 34n is immediately closed to block the optical path of the luminous flux. Then, as shown in FIG. 17(d), the exposure region of the divided pattern 54 reaches the +X side from the projection region groups 34m and 34n, and the exposure of the divided pattern 54 is completed.

Subsequently, to expose the divided pattern 53, the mask M and the glass substrate P are temporarily fed in the −X direction in a preliminary manner and, as shown in FIG. 17(e), the exposure region of the divided pattern 53 is positioned in the X side of the projection region groups 34m and 34n (as in the above case, the amounts of preliminary feeding are different for the mask M and the glass substrate P). At this time, the optical path of a luminous flux is in a blocked state. Then, the mask M and the glass substrate P are moved in the +X direction in synchronization. As in the above case, when the alignment system 49b detects the alignment mark 60b, and the overlapping part 53a reaches the projection region group 34m, the illumination shutter 12 corresponding to the projection region group 34n is immediately opened. When the alignment system 49b detects the alignment mark 59b, and the overlapping part 53a reaches the projection region group 34n, the illumination shutter 12 corresponding to the projection region group 34n is immediately opened to open the optical path. In this way, the portions of the divided pattern 53 are sequentially transferred onto the glass substrate P. As shown in FIG. 17(f), the exposure region of the divided pattern 53 reaches the +X side of the projection region groups 34m and 34n, and then the exposure of the divided pattern 53 is completed.

Subsequently, to expose the divided pattern 52, the mask M is moved by a length L24 stepwise in the −Y direction, and the glass substrate P is moved by a length L21 stepwise in the −Y direction. Accordingly, as shown in FIG. 17(g), the exposure region of the divided pattern 52 is positioned in the +X side of the projection region groups 34m and 34n. Then, the mask M and the glass substrate P are moved in the −X direction in synchronization while the optical path of the luminous flux is blocked by the illumination shutter 12. Before the divided pattern 52 reaches each of the projection region groups 34m and 34n, the illumination shutter 12 corresponding to the projection region groups 34m and 34n is opened to release the optical path of the luminous flux. When the alignment system 49a detects the alignment mark 59a during the synchronous movement, the illumination shutter 12 corresponding to the projection region group 34n is immediately closed. When the alignment system 49a detects the alignment mark 60a, the illumination shutter 12 corresponding to the projection region group 34m is immediately closed to block the optical path of the luminous flux. In this way, the divided pattern 52 is transferred onto the glass substrate P, and an LCD pattern LP is synthesized.

In the scanning exposure method and the scanning exposure system of the embodiment the same effects are obtained as those for the first embodiment. In addition, the amount of preliminary feeding is small compared with the first embodiment, where the mask M and the glass substrate P are fed in a preliminary manner to a next scanning exposure start position for each end of the scanning exposure of the divided patterns. Accordingly, the moving distance of the mask M and the glass substrate P from the scanning exposure end position of the preceding divided patterns to the scanning exposure start position of the succeeding divided patterns is shortened, thus improving throughput. According to the embodiment, by detecting the alignment marks 57a to 60a, and 57b to 60b formed simultaneously with the divided patterns of the mask M, switching is made between the shielding/irradiation of a luminous flux to the projection region groups 34m and 34n by the illumination shutter 12. Thus, compared with the case of detecting the positions of the mask stage 4 and the substrate stage 5, the driving timing of the illumination shutter 12 can be more accurate.

Note that, in the constitution of the embodiment, the joining marks are used also as alignment marks for image-forming characteristic correction. However, the invention is not limited to such a constitution, and dedicated marks may be prepared for individual purposes. In addition, the embodiment was described based on the case of exposure carried out by detecting the position of the overlapping part of the divided pattern by using the alignment marks or the like. However, the starting and ending of the exposure may be controlled by using the laser interferometers 39 and 43 and based on the position of each stage, and the positions of the mask and the substrate with respect to the stages.

In the first embodiment, the synchronous moving directions were all in the same direction. However, as in the second embodiment, only the divided patterns 51 and 52, and 53 and 54, both of which are adjacent to each other in the synchronous moving direction, may be set in the sane direction. In addition, an individual synchronous moving direction may be set for each divided pattern. In such a case, the synchronous moving direction is set by selecting an exposure order, where the moving distance of the mask M and the glass substrate P is the shortest according to an optimized exposure order. In any case, when the overlapping part of the divided parts adjacent in the synchronous moving direction is arranged in front in the synchronous moving direction of the divided patterns, an exposing light is released when the overlapping part is positioned in the projection region. When the overlapping part is arranged behind in the synchronous moving direction of the divided patterns, the exposing light is blocked when the overlapping part is positioned in the projection region. Accordingly, without any dependence on the synchronous moving direction, as described above with reference to the first embodiment, each of the distributions of exposure amounts for the overlapping parts 51a to 54a, 51b to 54b, and 51c to 54c is set equal to that for the non-overlapping part.

Further, in the embodiment, the overlapping parts 51b to 54b and 51c to 54c are overlappingly exposed by the end 35k of the projection region 34e and the end 35j of the projection region 34a. However, according to the length of the LCD pattern in the Y direction, the projection region used for overlapping exposure may be changed as the occasion demands. For example, the overlapping parts 51b, 52b, 51c and 52c may be exposed by the end 35k of the projection region 34e, while the overlapping parts 53b, 54b, 53c and 54c may be exposed by the end 35b of the projection region 34b. In this case, when the overlapping parts 53b, 54b, 53c and 54c are exposed, it is necessary only to keep closed the illumination shutter 12 corresponding to the projection region 34a during exposure. The same applies when overlapping exposure is carried out by the ends 35g and 35j. Thus, for exposure of the overlapping part of the divided patterns adjacent to each other in the Y direction, without any dependence on the end shape of 1 the projection region, the distributions of exposure amounts can be set equal between the overlapping part and the non-overlapping part. Also, as described above, even in such a case, the synchronous moving direction can be individually set for each divided pattern without limiting the synchronous moving direction.

Figure 18:
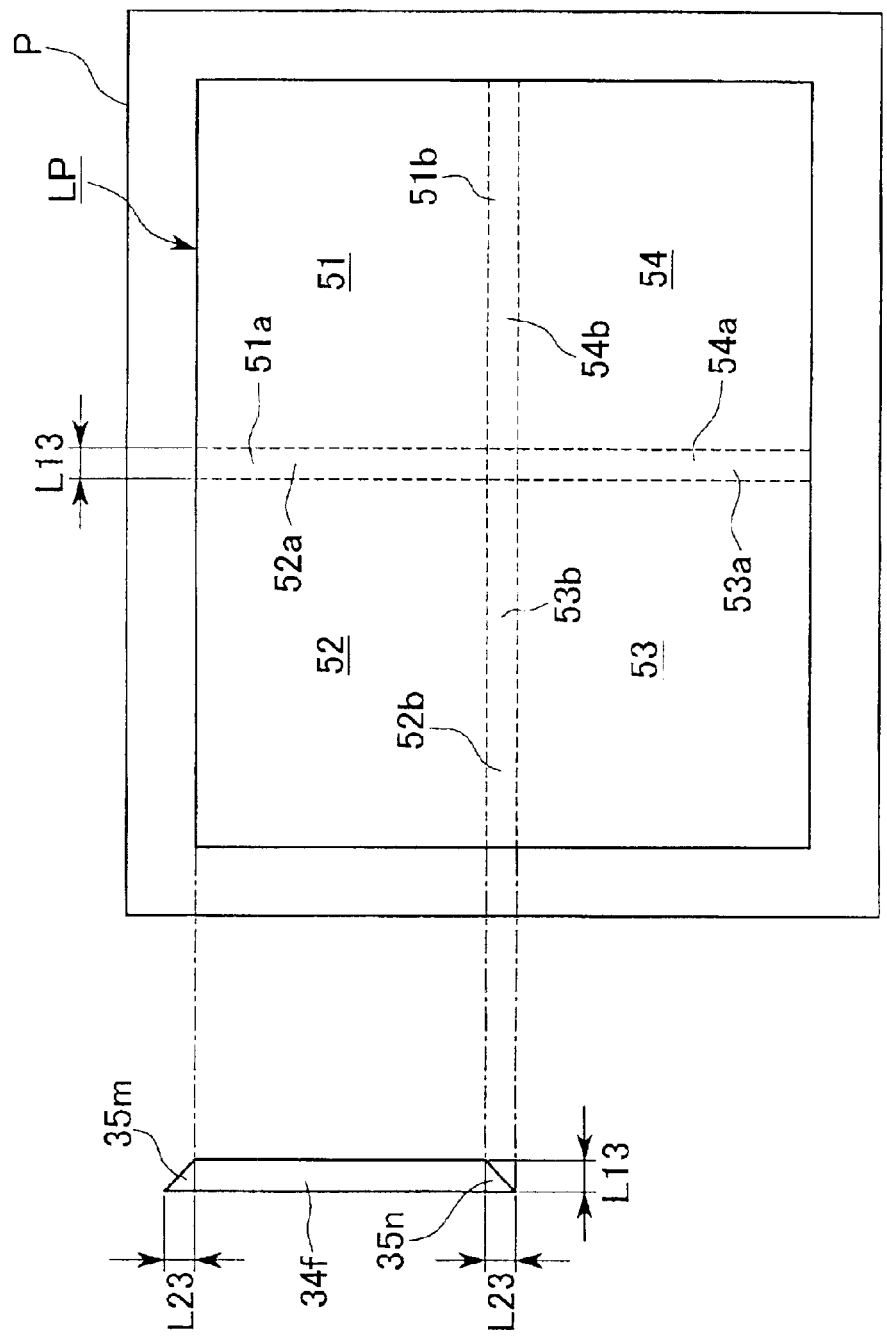
FIG. 18 is a plan view showing a positional relation between a single projection region and a glass substrate according to a third embodiment of the invention.

In the embodiment, the projection optical system 3 includes the plurality of projection system modules 3a to 3e, and the plurality of projection regions 34a to 34e are arrayed in parallel. However, the invention is not limited to such a constitution, and as shown in FIG. 18, a projection optical system having a single projection region 34f may be used. In this case, the width of the projection region 34f is set at a length L13, which is equal to the width of each of the overlapping parts 51a to 54a In addition, the width of each of the ends 35m and 35n of the projection region 34f in the Y direction is set at a length L23, which is equal to the width of each of the overlapping parts 51b to 54b.

On the other hand, in the embodiment, the width of the projection region in the synchronous moving direction is substantially equal to the width L13 of each of the overlapping parts 51a to 54a and 51c to 54c in the X direction. However, by making variable the size of the projection region with respect to the field diaphragm 26, a width of each of the overlapping parts 51a to 54a, and 51c to 54c can be set as desired. In this case, because of a change in the size of the projection region, the positions of the ends 35a to 35h are not coincident with one another in the projection regions 34a to 34e adjacent in the Y direction. Accordingly, the projection system modules 3a to 3e are moved according to the change of the projection region, or the image shifting mechanism 23 is adjusted to shift the position of each of the projections regions 34a to 34e in the Y direction (also in the X direction as the occasion demands).

Figure 19:
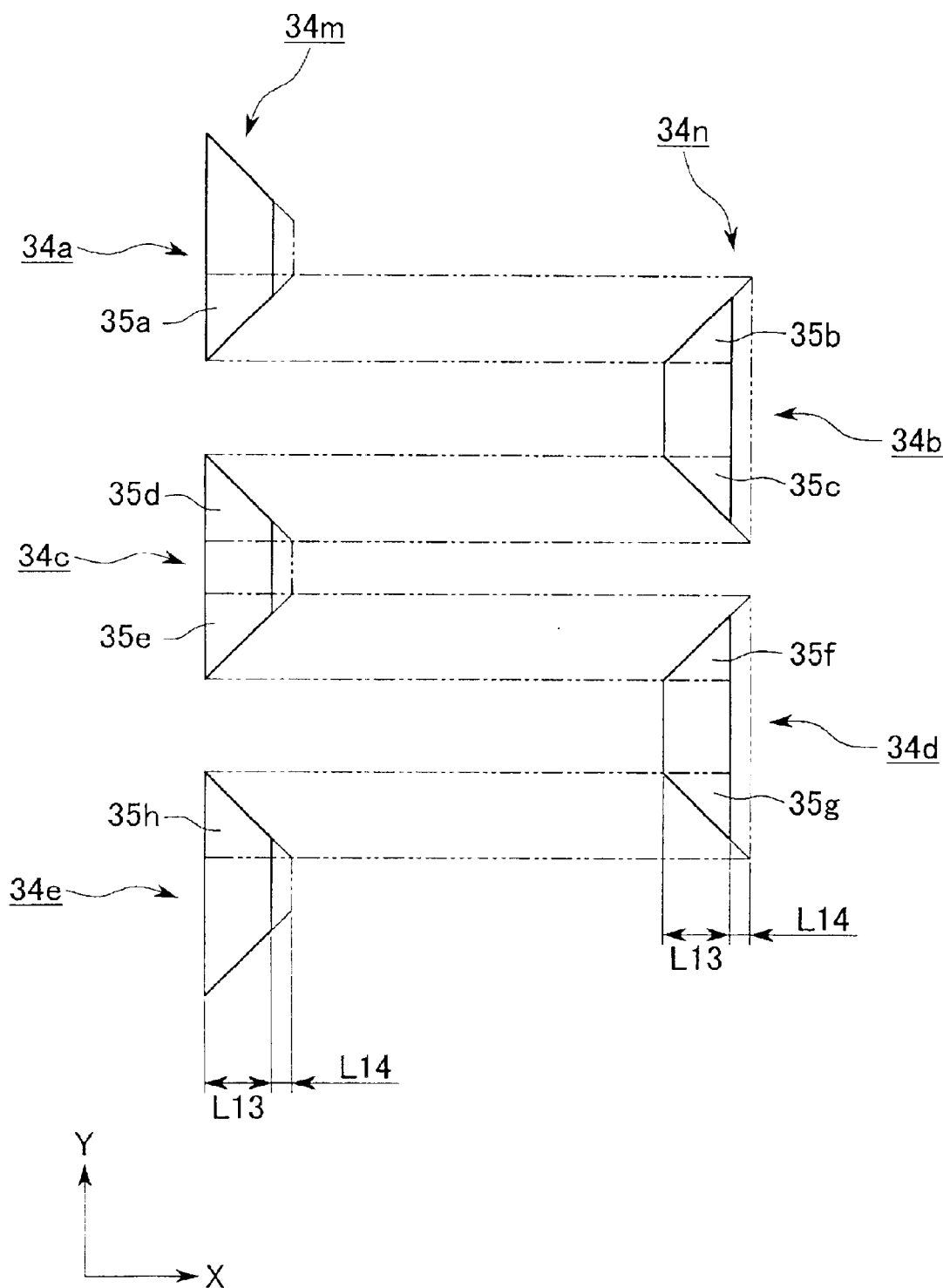
FIG. 19 is a plan view illustrating a method for changing the size of the projection region.

Further, as shown in FIG. 19, when the size of the projection region is changed, in the respective projection regions 3a to 3e, for example, the sides thereof in the +X side (the projection region group 34m is a short side, and the projection region group 34n is a long side) are moved in the same direction, each by a length L14, and thereby the positions of the ends 35a to 35h adjacent in the Y direction coincide with one another in the Y direction. Accordingly, the necessity of shifting the position of each of the projection regions 34a to 34e is eliminated, and thus the width of each of the overlapping parts 51a to 54a, and 51c to 54c becomes L13+L14, making it possible to set the desired value. The same applies even when the side in the +X side is moved in the −X direction or the side in the −X side is moved.

In the embodiment, the LCD pattern LP is picture-synthesized on the glass substrate P by scanning exposure, which is carried out four times. However, the invention is not limited to such a constitution, and picture synthesis may be carried out on the glass substrate P by, for example by scanning the exposure three times or more, alternatively, by scanning the exposure five times or more. In addition, instead of one light source 6, a plurality of light sources may be provided, one for each optical path. By using light guides or the like, lights from a plurality of light sources (or one) may be synthesized into one, and then branched for each optical path. In such a case, any adverse effects due to variance in the light amounts of the light sources can be eliminated. Moreover, even when one of the light sources goes off, it is possible to prevent an exposed device from becoming unusable though the entire light amount is reduced.

In the embodiment, the optical path through each of the projection system modules 3a to 3e is shielded by the illumination shutter 12. However, the invention is not limited to such a constitution. For example, a transmission inhibition portion having zero transmittance may be provided in the filter 21, and when the optical path is shielded, the transmission inhibition portion may be positioned in the optical path.

It should be noted that the magnification of each of the projection system modules 3a to 3e may be unmagnified, reduced or magnified. When far ultraviolet rays such as excimer lasers are used for the projection system modules 3a to 3e, as a nitric material, a material such as quartz, fluorite or the like transmitting far ultraviolet rays may be used. When F2 lasers or X rays are used, a reflection refractive type or refractive type (reflection type is also used for the mask M) optical system may be used. In addition, the invention can be applied to a proximity exposure system adapted to expose the pattern of the mask M by bringing the mask M and the glass substrate P into tight contact with each other without using the projection system modules 3a to 3e.

Next, a description will be given of the scanning exposure method and scanning exposure system according to the fourth embodiment of the invention by referring to FIGS. 20 to 30. In the description, as a substrate, a square glass substrate used for the manufacturing of a liquid crystal display panel is used, and an example is given, where the circuit pattern of a liquid crystal display device formed on a reticle is picture-synthesized in an erect unmagnified manner on the glass substrate by a step and scan exposure system.

Figure 20:
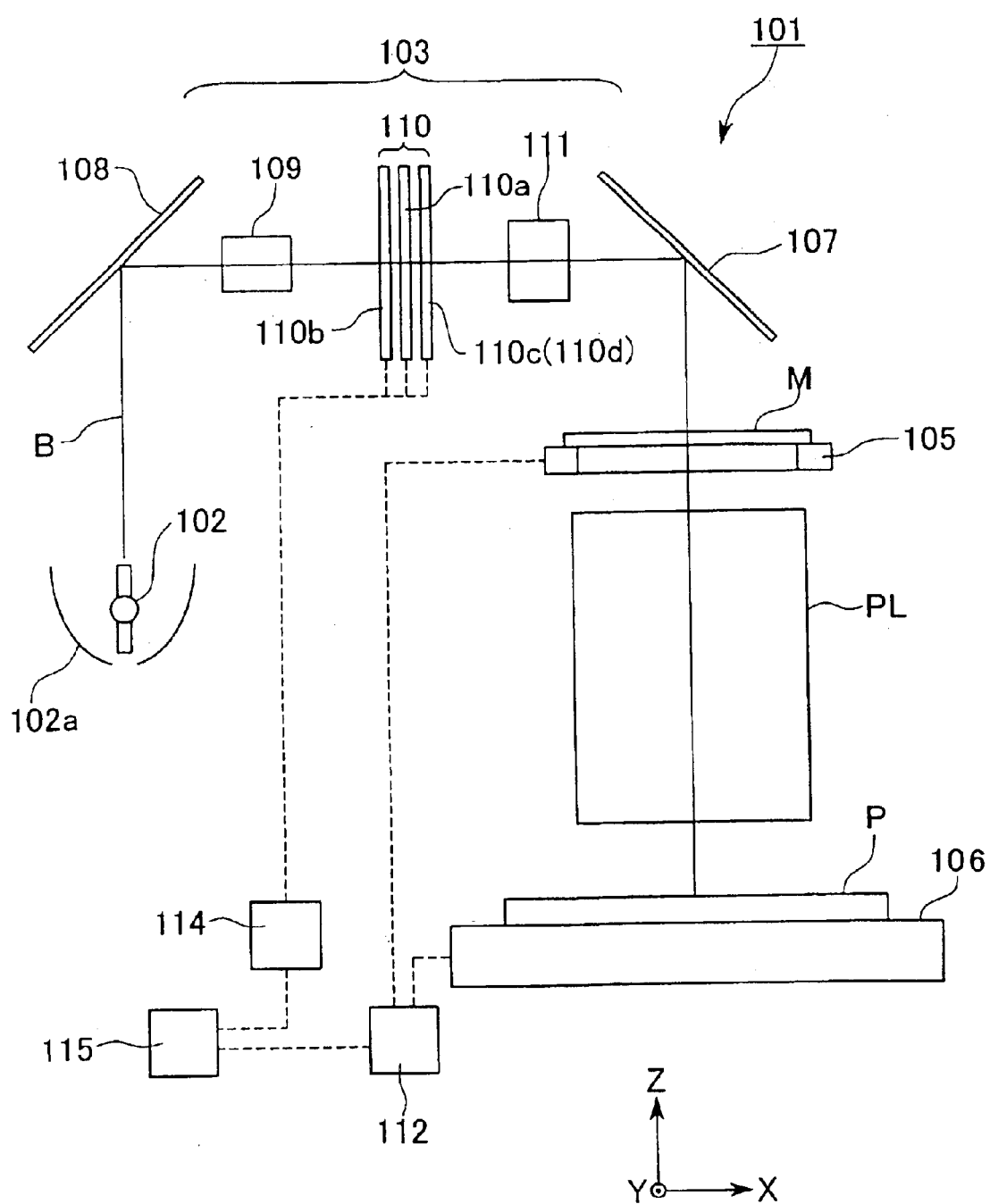
FIG. 20 is a view schematically showing an optical system of a scanning exposure system according to a fourth embodiment of the invention.

FIG. 20 is a constitutional view schematically showing the optical system of a scanning exposure system 101.

The scanning exposure system 101 is designed to project and transfer a pattern (for example, a liquid crystal display device pattern) formed on a mask M (reticle) onto a photosensitive glass substrate (substrate) P coated with resist or the like. The scanning exposure system 101 comprises, in its schematic constitution, a light source 102, an illumination optical system 103, a projection optical system PL, a mask stage 1105 and a substrate stage 106. It should be noted that as in the case of the first embodiment, the mask M and the glass substrate P are arranged along the XY plane. Hereinafter, it is assumed that the mask M and the glass substrate P are arranged along the XY plane, the scanning direction (synchronous moving direction) of the Y plane is the X direction (left and right direction in FIG. 1), the non-scanning direction orthogonal to the X direction is the Y direction (direction orthogonal to a paper surface in FIG. 1), and the direction of the optical axis orthogonal to the XY plane is the Z direction.

The light source 102 emits a beam B as an exposing light, and includes an extra-high pressure mercury lamp or the like. In the light source 102, an elliptic mirror 102a is additionally provided, which has a reflection surface including a rotary elliptic surface, and converges the exposing light emitted from the light source 102. The light source 102 is positioned in the first focal position of the elliptic mirror 102. Thus, the illumination beam B emitted from the light source 102 is passed through a reflecting mirror 107, and forms a light source image in the second focal position of the elliptic mirror 102a. Near the second focal position, a shutter (not shown) is provided and, by opening/closing the shutter for the beam B, switching is carried out between an exposing state and a non-exposing state.

The illumination optical system 103 includes, in its schematic constitution, reflecting mirrors 107 and 108, a wavelength selection filter (not shown), an optical integrator 109 such as a fly-eye lens or the like, a reticle blind (illumination region setting device) 110, and a lens system 111. The beam B converged in the second focal position and then diverged is converted into substantially parallel luminous fluxes, and made incident on the wavelength selection filter adapted to transmit only the luminous fluxes of a desired wavelength region. The beam B of an exposure wavelength (for example, g or i line) selected by the wavelength selection filter is made incident on the optical integrator 109.

The optical integrator 109 includes a number of positive lens elements vertically and horizontally arrayed such that a center axis thereof can be extended along an optical axis. Accordingly, the beam B made incident on the optical integrator 109 is wavefront divided by a number of lens elements, and forms a secondary light source including light source images equal in number to the lens elements near the emitting surface of the optical integrator 109. In other words, an illuminant surface is substantially formed at the emitting side of the optical integrator 109.

The beam B from the secondary light source illuminates the reticle blind 110. The reticle blind 110 is arranged between the light source 102 and the mask M, and sets an exposure spot (illumination region) for the mask M. The reticle blind 10 is arranged in a position substantially conjugate optically with the mask M. Note that the constitution and operation of the reticle blind 110 will be described later.

The mask stage 105 holds the mask M, and has a stroke long in the X direction for one-dimensional scanning exposure, and a very small amount of stroke, about several mm, in the Y direction orthogonal to the scanning direction. A moving mirror, not shown, is provided on the mask stage 105. A laser light emitted from a laser interferometer (not shown) is reflected by the moving mirror and, based on interference between the reflected light and the incident light, the distance between the moving mirror and the laser interferometer, that is, the position of the mask stage 1–5 (thus, the position of the mask M), is detected. The driving of the mask stage 105 is controlled by a state control unit 112.

The projection optical system PL forms an image of the pattern of the mask M present at an exposure spot on the glass substrate P in an erect unmagnified manner.

The substrate stage 106 holds the glass substrate P and, similarly to the mask stage 105, has a stroke long in the X direction for one-dimensional scanning exposure, and a long stroke for stepwise movement in the Y direction orthogonal to the scanning direction. Also, on the substrate stage 106, a moving mirror (not shown) is provided. By a laser interferometer (not shown), the distance between the moving mirror and the laser interferometer, that is, the position of the substrate stage 106 (thus, the position of the glass substrate P), is detected. The driving of this substrate stage 106 is also controlled by the stage control unit 112.

The beam B transmitted through the mask M is passed through the projection optical system PL, and then forms an image on the glass substrate P. A pattern image present in the exposure spot of the mask M is formed in the exposure region on the glass substrate P. Then, by moving the mask M and the glass substrate P in the X direction in synchronization with the mask stage 105 and the substrate stage 106 with respect to the beam B while detecting the positions of the mask stage 105 and the substrate stage 106, the patterns of the mask M positioned in the exposure spot are sequentially transferred onto the glass substrate P.

Figure 21:
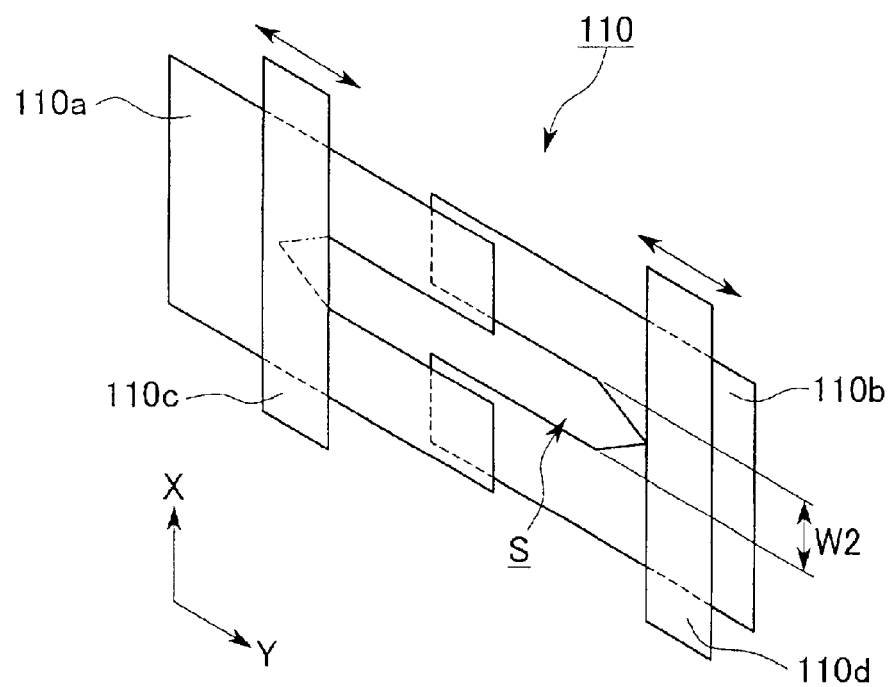
FIG. 21 is a perspective view showing the appearance of a reticle blind constituting the scanning exposure system of FIG. 20.
Figure 22:
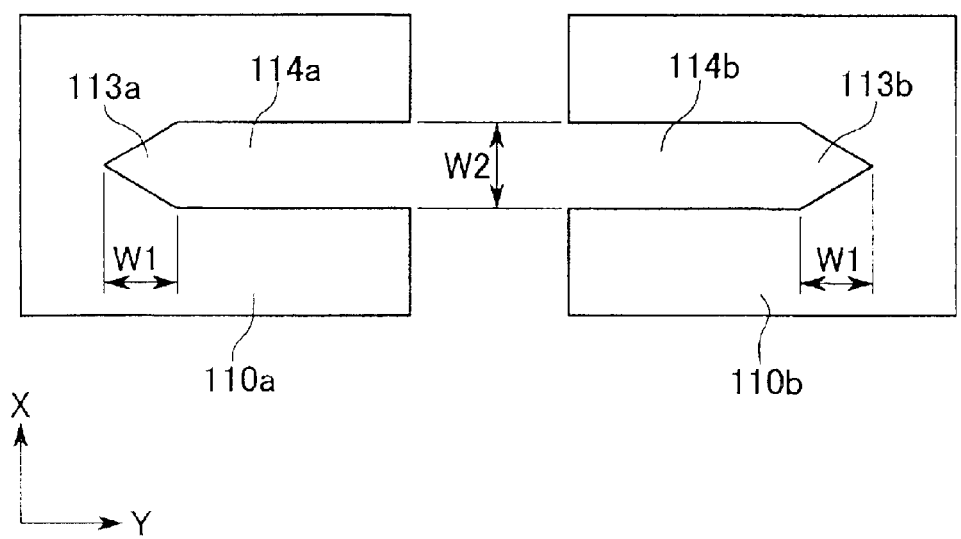
FIG. 22 is a plan view showing a blind plate constituting the reticle blind.

As shown in FIG. 21, the reticle blind 110 includes a pair of blind plates 110a and 110b, and a pair of end light-shielding blind plates 110c and 110d. The blind plates 110a and 110b are arranged sandwiching and substantially in parallel with the conjugate surface of the mask M, and symmetrical left and right, respectively having openings composed of equilateral triangular ends 113a and 113b, with a width thereof in the Y direction having been set at W1, and rectangular parts 114a and 114b, with a width thereof having been set at W2. The blind plates 110a and 110b are freely movable in the Y direction independently of each other. By making the positions of the blind plates 110a and 110b coincident with each other in the X direction, a hexagonal exposure spot S is set by the width W2 according to a region where the openings overlap each other.

Thus, by controlling the position of each of the blind plates 110a and 111b in the Y direction, the length along the non-scanning direction (Y direction) of the exposure spot can be optionally changed. Also, since each of the ends 113a and 113b of the non-scanning direction have a triangular shape, the illuminance gradient of a region scanned and exposed by this portion is proportionally reduced by 100 to 0% toward the boundary (it should be noted that the coordinate systems shown in each of FIGS. 2 and 3 are set to correspond to the exposure spot on the mask M for convenience).

The end light-shielding blind plates 110c and 110d are freely movable in the Y direction independently of each other. By the movement of each of the end blind plates 110c and 110d, the beam B which passes through each of the ends 113a and 113b is released/blocked. In addition, as shown in FIG. 20, the driving of each of the blind plates 110a and 110b, and the end light-shielding blind plates 110c and 110d is controlled by a blind control unit (changing unit) 114. A main control unit 115 for generally controlling the blind control unit 114 and the stage control unit 112 is connected to the blind control unit 114. In this main control unit 115, exposure JOB data regarding the position, shape or the like of the exposure spot formed by the reticle blind 110 is entered beforehand.

Now, the mask M the glass substrate P used by the scanning exposure method and system of the embodiment will be described.

Figure 23:
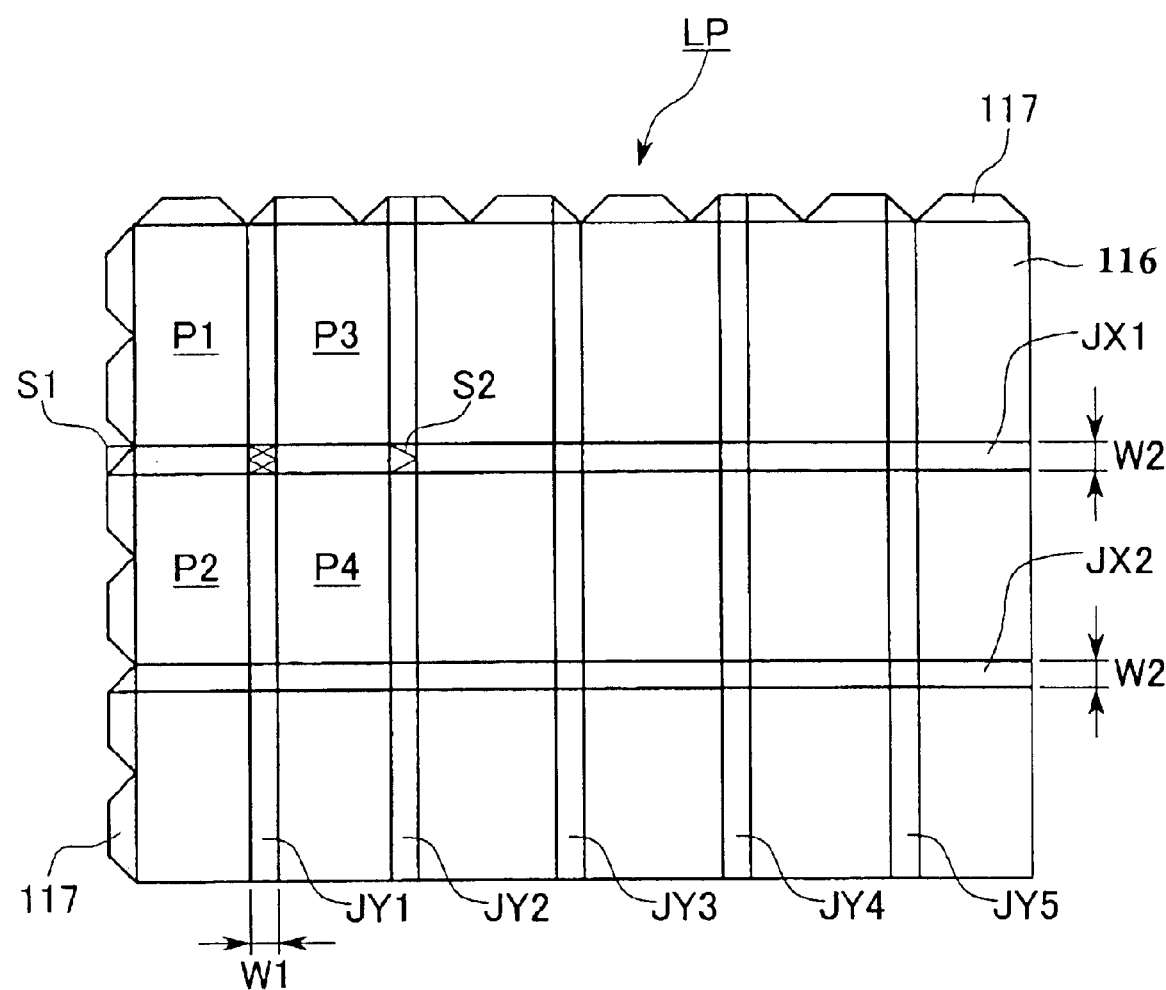
FIG. 23 is a plan view showing an LCD pattern picture-synthesized by a scanning exposure method of the invention.
Figure 24:
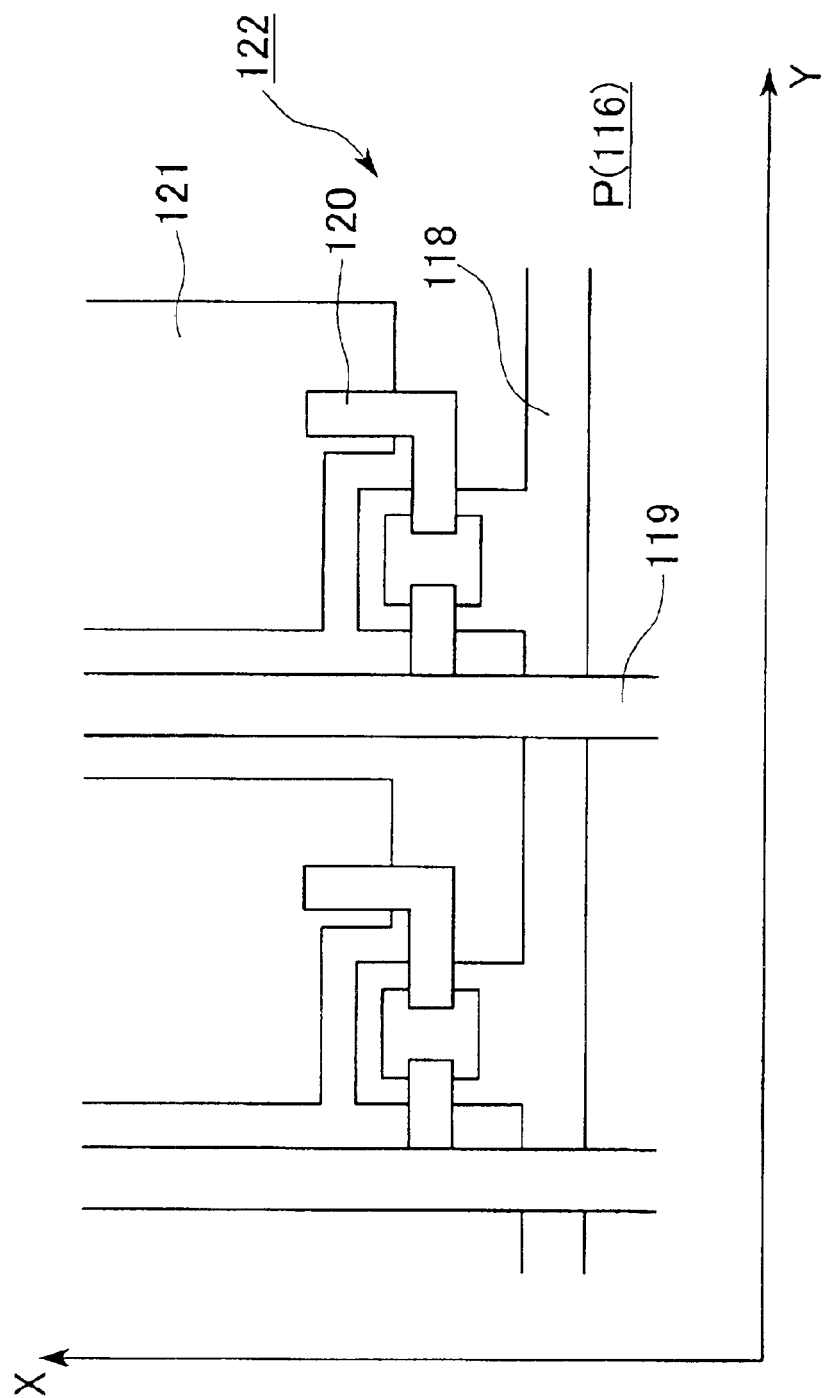
FIG. 24 is a constitutional view schematically showing a display pixel of a TFT/LCD constructed on a glass substrate.

As shown in FIG. 23, a TFT/LCD pattern LP roughly rectangular in shape is transferred to the glass substrate P. This LCD pattern LP includes a pixel portion 116, and for example a plurality of peripheral circuit portions 117 arranged at specified pitches along the side edges of the +X and −Y directions of the pixel portion 116. As shown in FIG. 24, in the pixel portion 116, a pixel pattern 122 composed of a gate line 118, a signal line 119, a drain 120 and a pixel electrode 121 is repeatedly arranged as a unit pattern at a specified pitch in the X and Y directions. In the peripheral circuit portion 117, a driver circuit or the like for driving the electrode of the pixel pattern 122 is repeatedly arrayed.

Such an LCD pattern LP is, as shown in FIG. 23, set to picture-synthesize 18 divided patterns. In this case, the divided patterns adjacent in the Y directions overlap each other at the overlapping parts JY1 to JY5 of the width W1 extended in the X direction, corresponding to the ends 113a and 113b of the exposure spot. The divided patterns adjacent in the X direction overlap each other at the overlapping parts JX1 and JX2 of the width W2 extended in the Y direction, corresponding to the width of the exposure spot in the X direction.

Figure 25:
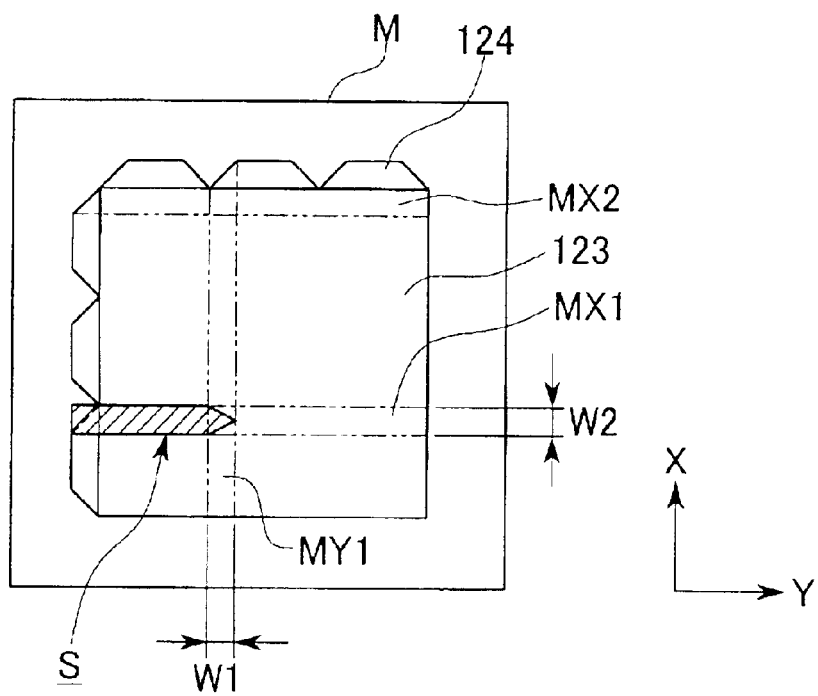
FIG. 25 is plan view showing a reticle used for picture-synthesizing the LCD pattern.
Figure 26:
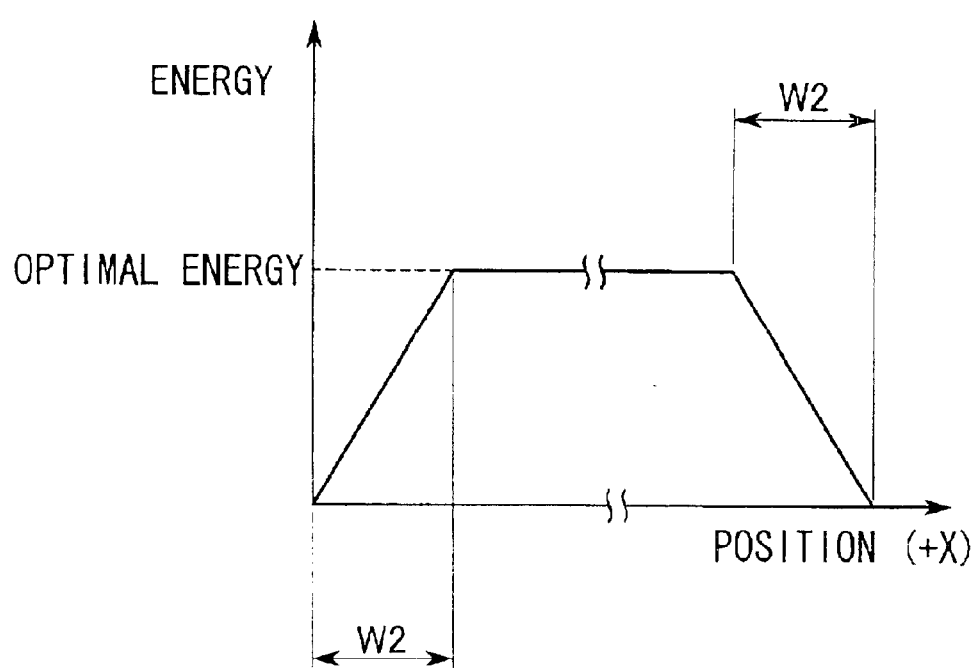
FIG. 26 is a view showing the relation between the position and the amount of energy on the glass substrate.

The mask M used for transferring the LCD pattern LP onto the glass substrate P is shown in FIG. 25. The mask M includes a pixel portion 123 and a peripheral circuit portion 124 respectively formed therein corresponding to the pixel portion 116 and the peripheral circuit portion 117 of the LCD pattern LP. By making use of the repeated characteristic of each of the pixel portion 123 and the peripheral circuit portion 124, an exposure spot corresponding to the mask M is adjusted to properly select a pattern on the mask M. Accordingly, each of the foregoing patterns constituting the LCD patterns LP can be set. Around the pixel portions 123 and the peripheral circuit portions 124, a light-shielding band (not shown) is formed.

Next, description will be made of the process of joining and exposing the divided patterns on the glass substrate P, and picture-synthesizing the LCD pattern LP by the scanning exposure system 101 constructed in the foregoing manner. In the description, an example is given of the process of joining, among 18 divided patterns, divided patterns (first and second patterns) P1 and P2 adjacent in the X direction, sandwiching the overlapping part JX1, and a divided pattern (third pattern) P3 and a divided pattern P4 adjacent to the divided patterns P1 and P2 in the Y direction, sandwiching the overlapping part JY1, and adjacent to each other in the X direction, sandwiching JX1.

In this case, it is assumed that the overlapping parts JX1 and JX2 are overlappingly exposed by the width W2 of the exposure spot set by the reticle blind 110, and the overlapping parts JY1 to JY5 are overlappingly exposed by the width W1 of the end of the exposure spot. Hereinbelow, it is assumed that the driving of each of the mask stage 105 and the substrate stage 106 is controlled by the main control unit 115 through the stage control unit 112, and the driving of the reticle blind 110 (the blind plates 110a and 110b, and the end light-shielding blind plates 110c and 110d) is controlled by the blind control unit 114 based on instructions from the main control unit 115.

First, the mask M and the glass substrate P are positioned in alignment. Then, based on the exposure JOB data, the mask stage 105 and the substrate stage 106 are driven, and the mask M and the glass substrate P are moved to the scanning start position of the divided pattern P1. At this time, in the reticle blind 110, the end light-shielding blind plate 110c shields the end 113a of the opening from a light, while the end light-shielding plate 110d releases the end 113b. Accordingly, the pentagonal exposure spot (illumination region) S shown in FIG. 25 is formed on the mask M.

In this case, the position of the exposure spot S in the X direction on the mask M is set on the virtual region MX1 of the width W2 corresponding to the overlapping part JX1 in the glass substrate P. Also, the position of the exposure spot S in the Y direction is set such that the end 113b can be positioned substantially along the side edge of the peripheral circuit portion 124 in the −Y side, and positioned on the virtual region MY1 of the width W1 corresponding to the overlapping part JY1 in the +Y side in the glass substrate P. The exposure spot on the glass substrate P in this case is denoted by reference numeral S1 in FIG. 23. In such a case, the exposure spot S is formed by the reticle blind 110, while the optical path of the beam B is blocked by the shutter.

Subsequently, the shutter is opened, and simultaneously the mask M and the glass substrate P are moved in the −X direction in synchronization. In this case, in the scanning exposure system 101 of the invention, since the projection optical system PL is an unmagnified erect system, the mask M and the glass substrate P are moved in the same direction at the same speed. In addition, during the scanning of the length W2 from the scanning exposure start, the driving (acceleration) of each of the mask M and the glass substrate P is controlled to reach a scanning speed (synchronous moving speed) for a proper exposure amount (amount of energy). As a result, as shown in the left side of the graph of FIG. 26, the glass substrate P is exposed by the amount of exposure energy having an illuminance gradient proportionally increased from 0 to an optimal value in the range of the length W2.

The scanning exposure advances and, when the exposure spot S passes through the peripheral circuit portion 124 in the +X side of the mask M and reaches the light, shielding band, the shutter is closed. As a result, in the non-overlapping part, exposure is carried out even to the outermost periphery of the pattern by a proper exposure amount. Then, by the foregoing process, the divided pattern P1 is exposed on the glass substrate P.

To expose the divided pattern P2, the mask M is moved in the X direction so as to position the exposure spot S in the virtual region MX1 on the mask M again. In this case, the virtual region MX1 of the mask M corresponds to the overlapping part JX2 on the glass substrate P. Simultaneously, the glass substrate P is also moved in the X direction so as to position an exposure spot S1 on the glass substrate P in the overlapping part JX2. At this time, as in the case of the exposure of the divided pattern P1, the end 113b of the exposure spot S is positioned in the virtual region MY1 on the mask M, and on the overlapping part JY1 on the glass substrate P. Accordingly, the movement of the mask M and the glass substrate P in the Y direction, and the driving of the reticle blind 110 are not executed.

Then, at the same time that the shutter is opened, the mask M and the glass substrate P are moved in the −X direction in synchronization. Also, in this case, similarly to the exposure of the divided pattern P1, during the scanning of the length W2 from the scanning exposure start, the driving of each of the mask M and the glass substrate P is controlled to reach a scanning speed for an optimal exposure amount. As a result, the overlapping part JX2 on the glass substrate P is also exposed by an amount of exposure energy having an illuminance gradient proportionally increased from 0 to an optimal value.

On the other hand, when the exposure of the divided pattern P2 is finished, a scanning speed is controlled to proportionally reduce the amount of exposure energy from the optimal value to 0 during the scanning of the length W2 in the overlapping part JX1. When the overlapping part JX1 coincides with the exposure spot S1, the shutter is closed to block beam B. By this scanning exposure, as shown in the right side of the graph of FIG. 26, the overlapping part JX1 is exposed by an amount of energy having an illuminance gradient proportionally reduced from the optimal value to 0 in the +X direction in the range of the length W2. Thus, the overlapping part JX1 is exposed twice in an overlapping manner when the divided patterns P1 and P2 are scanned and exposed. As a result, the total amount of exposure becomes an optimal exposure amount equal to that for the non-overlapping part.

In the above case, not the overlapping part JX2 but the overlapping part JX1 may be selected as a scanning start position (exposure spot S is set on the virtual region MX2 on the mask M), and the mask M and the glass substrate P may be moved in the +X direction in synchronization with respect to the exposure spot S. Also, in this case, as shown in the right side of the graph of FIG. 26, the overlapping part JX1 is exposed by an amount of exposure energy having an illuminance gradient proportionally reduced from the optimal value to 0 in the +X direction, bringing about the same result as above.

Figure 27:
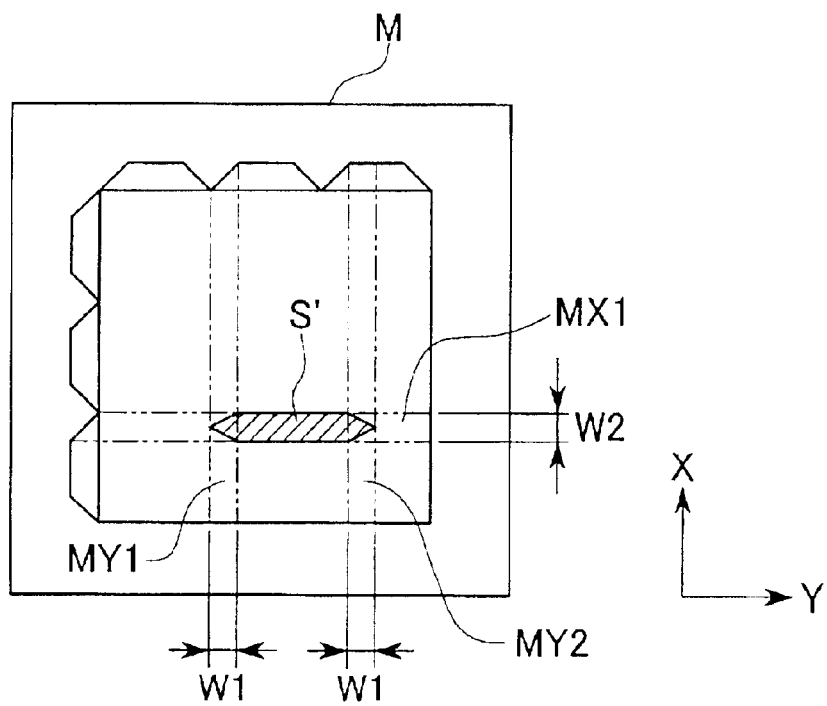
FIG. 27 is a plan view showing the reticle having an exposure spot set in a scanning exposure starting position of a divided pattern P2.

To expose the divided pattern P3, first, in the reticle blind 110, the end light-shielding blind plate 110c is moved, the optical path of the end 113a is opened, and the blind plates 110a and 110b are driven so that the ends 113a and 113b can be respectively positioned in the overlapping parts JY1 and JY2 on the glass substrate P. In this way, a hexagonal exposure spot (illumination region) S' shown in FIG. 27 is formed on the mask M.

While the reticle blind 110 is driven, the mask stage 105 and the substrate stage 106 are moved stepwise in the Y direction, and the mask M and the glass substrate P are moved to the scanning start position of the divided pattern P3. At this time, the position of the exposure spot S' on the mask M in the X direction is set on the virtual region MX1 corresponding to the overlapping part JX1. Also, the position of the exposure spot S' in the Y direction is set such that the ends 113a and 113b can be positioned on the virtual regions MY1 and MY2 of the width W1 respectively corresponding to the overlapping parts JY1 and JY2 in the glass substrate P. An exposure spot on the glass substrate P at this time is denoted by a reference numeral S2 in FIG. 23.

Then, similarly to the scanning exposure of the divided pattern P1, the shutter is opened and, simultaneously, the mask M and the glass substrate P are moved in the −X direction in synchronization while accelerating. Then, these portions are moved at equal speeds in the non-overlapping part, and the divided pattern P3 is scanned and exposed on the glass substrate P. Subsequently, the mask M and the glass substrate P are moved in the X direction, and the divided pattern P4 is scanned and exposed by the same process as that for the divided pattern P2.

Figure 28:
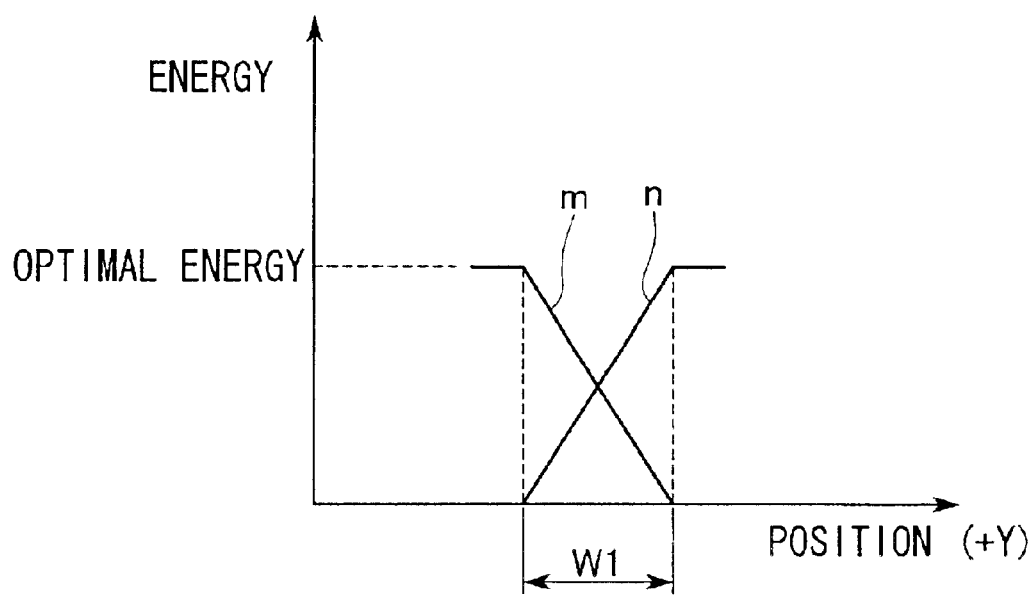
FIG. 28 is a view showing the relation between the position and the amount of energy on the glass substrate.

During the scanning exposure of the divided patterns P1 to P4, by the exposure of the divided patterns P1 and P2, the overlapping part JY1 on the glass substrate P is exposed by an illuminance gradient proportionally reduced from 100 to 0% in the +Y direction by the end 13b, denoted by the code m in FIG. 28. On the other hand, the overlapping part JY1 is exposed by an illuminance gradient proportionally increased from 0 to 100% in the +Y direction by the end 113a, denoted by the code n in FIG. 28. Accordingly, in the overlapping part JX1 on the glass substrate P, as a result of exposure executed twice in an overlapping manner during the scanning exposure of the divided patterns P1 to P4, the total amount of exposure becomes an optimal exposure amount equal to that for the non-overlapping part.

Figure 29:
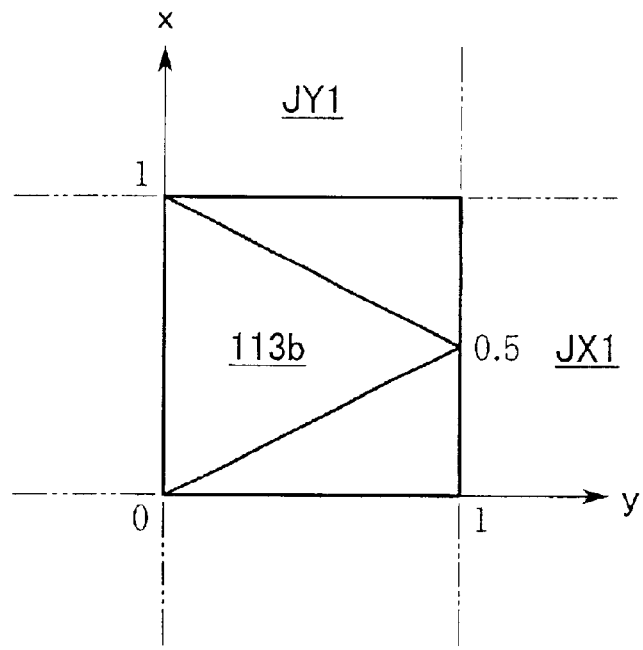
FIG. 29 is a view illustrating an exposure amount distribution of an intersection portion between overlapping parts JX1 and JY1.
Figure 30:
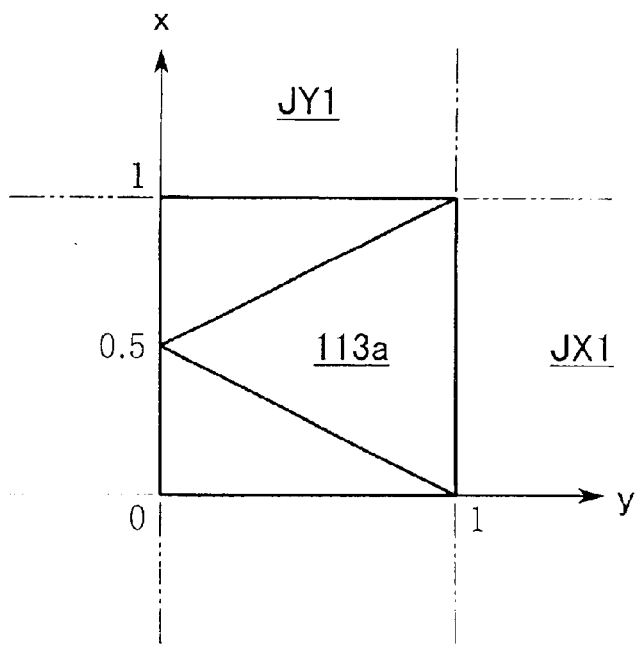
FIG. 30 is a view illustrating an exposure amount distribution of an intersection portion between overlapping parts JX1 and JY1.

Then, as a result of the foregoing exposure of the divided patterns P1 to P4, the rectangular intersection portion of the overlapping parts JX1 and JY1 is exposed four times in an overlapping manner. Thus, the distribution of an exposure amount in such a portion will be described briefly. In this case, as shown in FIGS. 29 and 30, the left lower end of the intersection portion is set at $x=y=0$, and normalization is carried out so as to set the intersection portion in the range of $0 \leq x \leq 1, 0 \leq y \leq 1$. Also, the exposure amount in this range is denoted by z, and the exposure amount in the non-overlapping part is set to $z=1$.

First, as shown in FIG. 29, for the divided patterns P1 and P2, the intersection portion is exposed by the end 113b. In this case, during the exposure of the divided pattern P1, the intersection portion is exposed with the distribution of an exposure amount represented by the following function:

where $x<0.5xy$, $z=0$ where $x \geq 0.5xy$, and $x \leq -0.5y+1$, $z=x-0.5xy$ where $x>-0.5y+1$, $z=1-y$ (1)

During the exposure of the divided pattern P2, the intersection portion is exposed with the distribution of an exposure amount represented by the following function:

where $x<0.5xy$, $z=1-y$ where $x \geq 0.5xy$, and $x \leq -0.5y+1$, $z=1-x-0.5xy$ where $x>-0.5y+1$, $z=0$ (2)

On the other hand, for the divided patterns P3 and P4, as shown in FIG. 30, the intersection portion is exposed by the end 113a. In this case, during the exposure of the divided pattern P3, the intersection portion is exposed with the distribution of an exposure amount represented by the following function:

where $x<-0.5xy+0.5$, $z=0$ where $x \geq -0.5xy+0.5$, and $x \leq -0.5y+0.5$, $z=x+0.5xy-0.5$ where $x>-0.5y+0.5$, $z=y$ (3)

During the exposure of the divided pattern P4, the intersection portion is exposed with the distribution of an exposure amount represented by the following function:

where $x<-0.5xy+0.5$, $z=y$ where $x \geq -0.5xy+0.5$, and $x \leq -0.5y+0.5$, $z=-x+0.5xy+0.5$ where $x>-0.5y+0.5$, $z=0$ (4)

Thus, during the exposure of the divided patterns P1 and P2, the distribution of the exposure amount for the intersection portion exposed by the end 113b has a gentle gradient represented by the function z=1−y as the sum of the functions (1) and (2). During the exposure of the divided patterns P3 and P4, the distribution of the exposure amount for the intersection portion exposed by the end 113a has a gentle gradient represented by the function z=y as the sum of the functions (3) and (4). As apparent from the foregoing, by exposing the divided patterns P1 to P4, the total amount of exposure in the intersection portion of the overlapping parts JX1 and JY1 becomes z=1, which is the sum of the functions (1) to (4), equal to that in the non-overlapping part.

Then, by the same process as for the foregoing, the divided patterns on the glass substrate P are sequentially exposed while an exposure spot on the mask M is properly selected, and the LCD pattern LP is thereby picture-synthesized with the same distribution of the exposure amount. Among the divided patterns, when the divided pattern positioned in the end of the +Y side in FIG. 23 is exposed, conversely to the case of the divided patterns P1 and P2, the end light-shielding blind plate 110d shields the end 113b of the opening, while the end light-shielding blind plate 110c opens the end 113a. Accordingly, a pentagonal exposure spot with right-left symmetry is formed. The order of exposing the divided patterns should preferably be set based on a path, where the moving distance (moving time) of each of the mask stage 105 and the substrate stage 106 is the shortest.

In the scanning exposure method and the scanning exposure system of the described embodiment, since the divided patterns are partially overlapped with each other by the distribution of an exposure amount having a gentle gradient when the mask M and the glass substrate P are moved in synchronization, these divided patterns can be smoothly joined. Thus, without any decrease in quality, higher accuracy and a larger liquid crystal display devices can be easily dealt accommodated. Especially, according to the embodiment, the amounts of exposure for the overlapping part and the non-overlapping part are controlled by a simple operation of setting the scanning speed for exposing the overlapping part of the divided patterns and the scanning speed for exposing the non-overlapping part to be different from each other. Thus, increases in the size and costs of the device can be prevented.

In addition, in the scanning exposure method and the scanning exposure system of the embodiment, since a one-layer LCD pattern LP can be picture-synthesized by adjusting the illumination region of one mask M, a small mask M can be used and the errors of the mask M itself can be suppressed. Further, reticle changing work necessary when a plurality of masks M are used can be eliminated, and correction work between the reticles, the accumulation of errors, and so on, can be reduced. Thus, joining exposure can be executed with higher accuracy.

Figure 31:
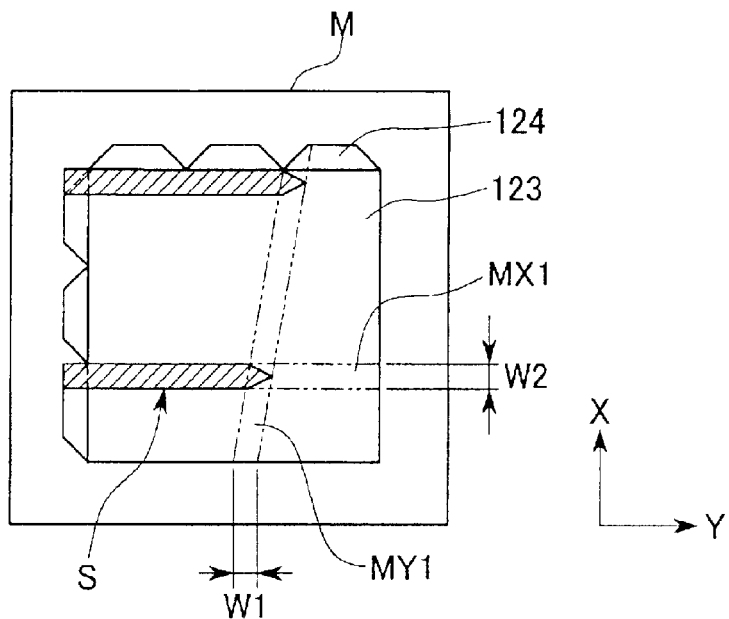
FIG. 31 is a plan view showing an operation of moving an exposure spot on a reticle in a direction orthogonal to the synchronous moving direction according to the fifth embodiment of the invention.
Figure 32:
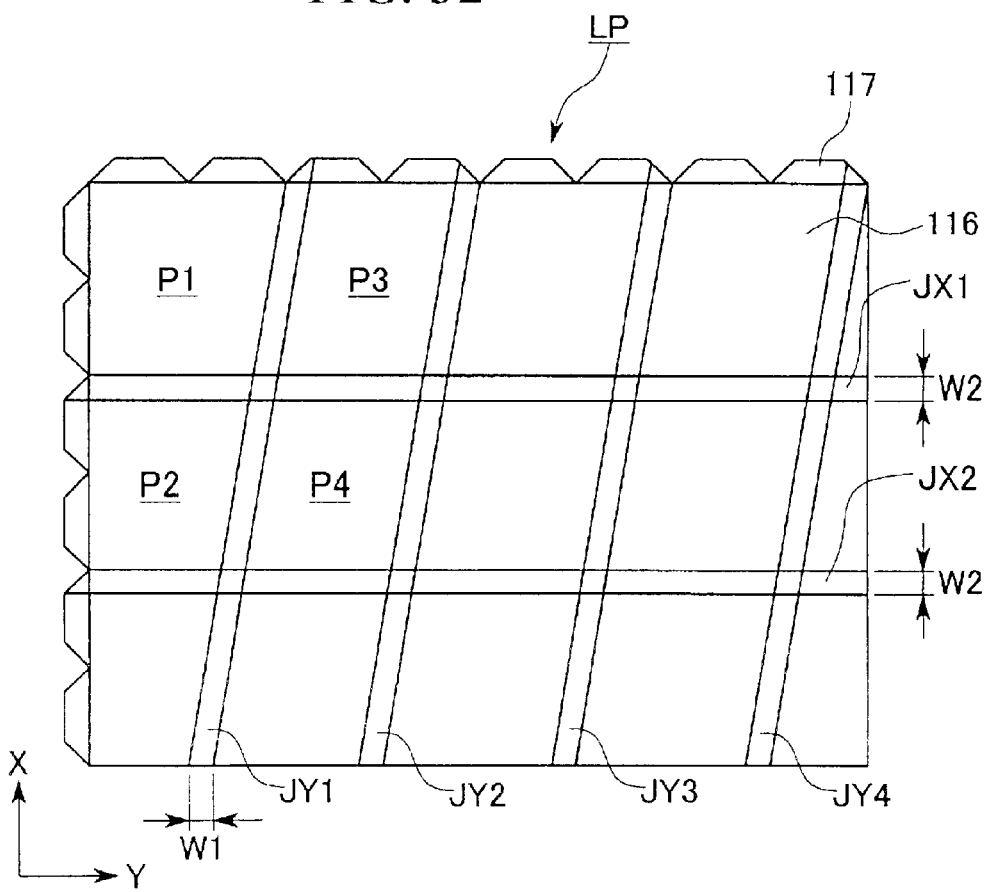
FIG. 32 is a plan view showing an LCD pattern picture-synthesized by using the reticle shown in FIG. 31.

Each of FIGS. 31 and 32 illustrates a scanning exposure method and a scanning exposure system according to a fifth embodiment of the invention. In these drawings, the same elements as those of the fourth embodiment shown in FIGS. 20 to 30 are added with the same reference numerals, and a description thereof will be omitted. The fifth embodiment is different from the fourth in that the size of the exposure spot S is changed during scanning exposure.

Specifically, according to the embodiment, to expose the divided pattern P1, as in the case of the fourth embodiment, an exposure spot S is set on the virtual region MX1 on the mask M. Then, the mask M and the glass substrate P are moved in the −X direction in synchronization to start the scanning exposure, and the blind plate 110b of the reticle blind 110 is simultaneously moved in the +Y direction at a fixed speed V. At this time, the end light-shielding blind plate 110d may be moved in synchronization with blind plate 110b. However, this movement is not necessary when the end light-shielding blind plate 110d is not in a position for shielding the end 113b. The blind plate 110a and the end light-shielding blind plate 110c are not moved in the Y direction, because the peripheral circuit portion 124 along the X direction is illuminated.

As a result, the exposure spot S is magnified in the +Y direction during the scanning exposure, and a virtual region MY1 on the mask M formed as the moving locus of the end 113b is provided with inclination with respect to the X direction by coupling the scanning speed and the moving speed of the blind plate 110b. Accordingly, in the divided pattern P1 exposed on the glass substrate P, as shown in FIG. 32, the overlapping part JY1 with the divided pattern P3 is formed along a direction different from the X direction.

To expose the divided pattern P2, at the starting time of scanning exposure, the end 113b of the exposure spot S is positioned on the extension of the overlapping part JY1 and on the overlapping part JX2, and the blind plate 110b is moved in the +Y direction at the same speed V as that for the divided pattern P1 (at this time, the scanning speed for each of the mask M and the glass substrate P are also set equal to that when the divided pattern P1 is exposed).

Further, to expose the divided pattern P3, on the glass substrate P, the ends 113a of the exposure spot are positioned in the intersection portion of the overlapping parts JX1 and JY1, and the ends 113b of the exposure spot are positioned in the intersection portion of the overlapping parts JX1 and JY2. Then, simultaneously with the start of scanning exposure, the blind plates 110a and 110b are both moved in the +Y direction at a speed V. Also, to expose the divided pattern P4, the ends 113a and 113b of the exposure spot are respectively positioned in the intersection portion of the overlapping parts JX2 and JY1, and in the intersection portion of the overlapping parts JX2 and JY2. Then, simultaneously with the start of scanning and exposure, the blind plates 110a and 110b are both moved in the +Y direction at a speed V.

The other divided patterns are subjected to scanning exposure by the same process while moving the blind plates in the +Y direction. When the divided pattern positioned at the end of the +Y side in FIG. 32 is exposed, conversely to the case of the divided patterns P1 and P2, the end light-shielding plate 110d shields the end 113b of the opening, and the end light-shielding blind plate 110c opens the end 113a. In this state, only the blind plate 110a is moved in the +Y direction during exposure. It should be noted that the control of the scanning speed in each of the overlapping parts JX1 and JX2 is similar to that of the fourth embodiment. Thus, as shown in FIG. 32, on the glass substrate P, an LCD pattern LP is picture-synthesized such that the divided patterns overlap each other by the overlapping parts JY1 to JY4 having an inclination in the X direction.

In the scanning exposure method and system of the described embodiment, in addition to an operation and an advantage similar to those of the fourth embodiment, since the arraying direction of the pixel patterns 122 is different from the extended direction of the overlapping parts JY1 to JY4, in the completed liquid crystal display device, a driving transistor in the pixel pattern 122 adjacent to each of the overlapping parts JY1 to JY4 is driven by a different signal line. Thus, errors are not arrayed in order, even with if the same overlapping accuracy is provided, and an effects of errors on the display quality can be reduced.

Figure 33:
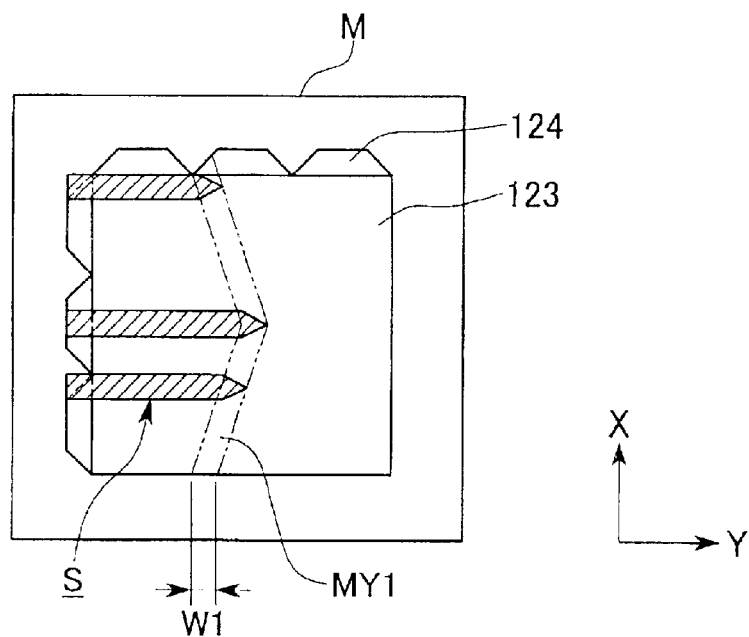
FIG. 33 is a plan view showing an operation of moving an exposure spot on a reticle in a direction orthogonal to a synchronous moving direction a plurality of times according to the sixth embodiment of the invention.
Figure 34:
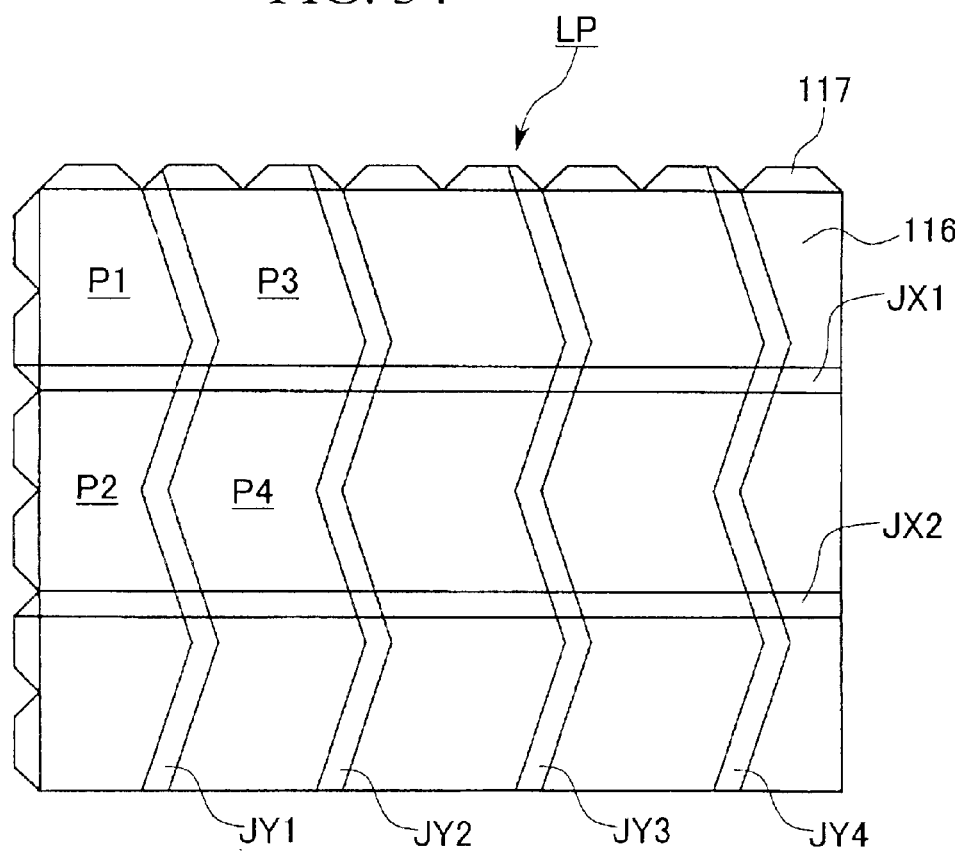
FIG. 34 is a plan view showing an LCD pattern picture-synthesized by using the reticle shown in FIG. 33.

In the fifth embodiment, the blind plates 110a and 110b are moved at the same speed during the exposure. However, the invention is not limited to such and, in each of the overlapping parts JY1 to JY5, the blind plates may be moved at different speeds as long as the moving speeds are equal during the exposure. In addition, when each of the overlapping parts JY1 to JY4 is exposed, the moving speeds of the blind plates 110a and 110b may be changed a plurality of times. For example, as shown in FIG. 33, during the scanning exposure of the divided pattern P1, the moving direction of the blind plate 110a may be changed from the +Y direction to −Y direction. Similarly, during the scanning exposure of the divided pattern P3, the moving direction of each of the blind plates 110a and 110b may be changed from the +Y direction to the −Y direction (when the divided pattern positioned at the end of the +Y side is exposed, while the end light-shielding blind plate 110d shields the end 113b, only the moving direction of the blind plate 110a is changed from the +Y direction to the −Y direction during the exposure). In this case, as shown in FIG. 34, overlapping parts JY1 to JY4 are formed in a zigzag pattern on the glass substrate P. As a result, signal lines for driving transistors are more dispersed, making it possible to reduce an effect on display quality more. In this case, without changing the moving directions of the blind plates 110a and 110b, only the moving speed V may be changed, or both of the moving directions and the moving speed may be changed.

In the fourth and fifth embodiments, the width of each of the overlapping parts JX1 and JX2 is set at the width W equal to a exposure spot S. However, if the amounts of exposure are equal between the overlapping part and the non-overlapping part as a result of double exposure, the width of the overlapping part is limited to equal. The shape of the exposure spot is not limited to a hexagon, and a square shape such as trapezoidal, a parallelogrammatic or the like, may be employed.

In the fourth and fifth embodiments, when the divided patterns P3 and P4 are exposed, the extended direction of the overlapping parts JY1 and JY2 is inclined with respect to the X direction by moving the blind plates 110a and 110b. However, when no changes occur in the size of the exposure spot, the mask M and the glass substrate P may be moved in synchronization from the X direction to the inclining direction.

In addition, the technology of the invention for making the amount of exposure for the overlapping parts adjacent in the synchronous moving direction coincident with that for the non-overlapping part by varying the synchronous moving speed of the mask M and the glass substrate P between the overlapping part and the non-overlapping part can also be applied to a so-called multilens constitution, where the projection optical system PL includes a plurality of projection system modules, the ends of the projection regions of the projection system modules adjacent to each other are arranged in parallel so as to overlap in the Y direction, and the amounts of exposure are set equal when the scanning exposure is carried out in the X direction.

For substrates, to which the invention can be applied, other than glass substrates P for liquid crystal display devices, semiconductor wafers for a semiconductor devices, ceramic wafers for thin-film magnetic heads, original (synthetic quartz, or silicon wafer) masks or reticles for exposure systems, or the like may be used.

The kinds of the scanning exposure systems 1 and 101 are not limited to exposure systems used for manufacturing liquid crystal display devices, and adapted to expose the pattern of the liquids crystal display devices on the glass substrate P. The invention can be widely applied to exposure systems used for manufacturing semiconductor devices, and adapted to expose patterns of the semiconductor devices on wafers, exposure systems used for manufacturing thin-film magnetic heads, an imaging device (CCD) or a reticle, or the like.

As the light sources 6 and 102, luminescent lines generated from the extra-high pressure mercury lamp (the g line (436 nm), h line (404.7 nm), i line (365 nm)), a KrF excimer laser (248 nm), ArF excimer laser (193 nm), F2 laser (157 nm) can be used.

The magnification of each of the projection system modules 3a to 3e may be unmagnified, reduced or magnified. In addition, for the projection system modules 3a to 3e, when far ultraviolet rays such as an excimer laser are used, as a nitric material, a material such as quartz, fluorite or the like transmitting far ultraviolet rays may be used. When F2 lasers or X rays are used, the optical system of the reflection refractive type or a refractive type (the reflection type is also used for the mask M) may be used. The invention can also be applied to a proximity exposure system for exposing the pattern of the mask M by bringing the mask M and the glass substrate P into tight contact with each other without using the projection system modules 3a to 3e.

When a linear motor (see U.S. Pat. No. 5,623,853, or U.S. Pat. No. 5,528,118) is used for the substrate stages 5 and 106 or the mask stages 4 and 105, either one of an air floating type using an air bearing or a magnetic floating type using Lorentz's force or a reactance force may be used. Each of the stages 4, 5, 105 and 106 may be a type moved along the guide, or may be a guideless type having no guides.

For the driving mechanisms 37 and 40 of the stages 4 and 5, a flat motor may be used to drive each of the stages 4 and 5 by arranging a magnet unit (permanent magnet) having a two-dimensionally arranged magnet and an armature unit having a two-dimensionally arranged coil oppositely to each other, and using an electromagnetic force. In this case, either one of the magnet unit or the armature unit may be connected to the stages 4 and 5, and the other may be provided at the moving surface side (base) of each of the stages 4 and 5. The same applies to the stages denoted by the reference numerals 105 and 106.

As described in Japanese Unexamined Patent Application, First Publication No. Hei 8-166475 (U.S. Pat. No. 5,528, 118), the reaction force generated by the movement of each of the substrate stages 5 and 106 may be mechanically dissipated to the floor (ground) by using a frame member so as not to transmit it to the projection optical system 3 and the PL. The invention can be applied to an exposure system having such a structure.

As described in Japanese Unexamined Patent Application, First Publication No. Hei 8-330224 (U.S. Ser. No. 08/416, 558), the reaction force generated by the movement of each of the mask stages 4 and 105 may be mechanically dissipated to the floor (ground) by using a frame member so as not to transmit it to the projection optical system 3 and the PL. The invention can be applied to an exposure system having such a structure.

Therefore, the scanning exposure system 1 as the substrate processor of the embodiment is manufactured by assembling various subsystems including components described in the appended claims in such a way as to maintain specified mechanical accuracy, electric accuracy and optical accuracy. To secure such accuracy, before/after the assembling of the components, various optical systems are adjusted to achieve optical accuracy; various mechanical systems to achieve mechanical accuracy; and various electric systems are adjusted to achieve electric accuracy. The process of assembling the exposure system by various sub-systems includes, among various sub-systems, mechanical connection wiring connection among the electric circuits, piping connections among pressure circuits, and so on. Needless to say, the process of assembling each sub-system is executed before this process of assembling the exposure system by various sub-systems. After the end of the process of assembling the exposure system by various sub-systems, an overall adjustment is carried out to secure the various types of accuracy for the entire exposure system. Preferably, the exposure system should be manufactured in a clean room having a controlled temperature, level of cleanliness, and so on.

Figure 35:
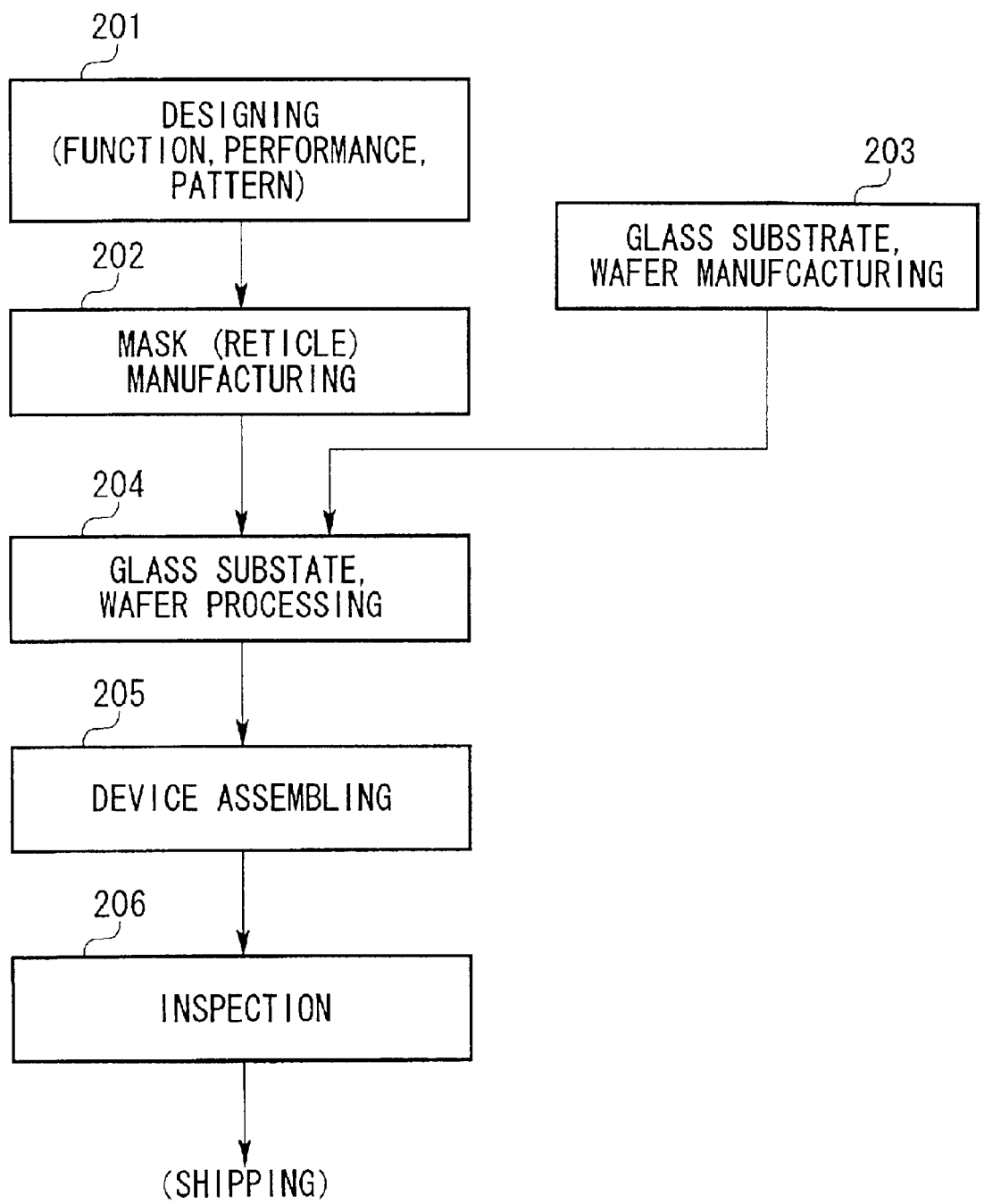
FIG. 35 is a flowchart showing an example of a manufacturing process of a liquid crystal display device.

A device such as a liquid crystal display device, a semiconductor device or the like is, as shown in FIG. 35, manufactured through a step 201 for designing the function/performance of the liquid crystal display device or the like, a step 202 for making a mask M (reticle) based on the result of the designing step, a step 203 for making a glass substrate P from quartz or the like, or a wafer from a silicon material, a step 204 for exposing the pattern of the mask M on the glass substrate P (or wafer) by the scanning exposure system 1 of the foregoing embodiment, a step 205 for assembling the liquid crystal display device or the like (in the case of a wafer, including dicing, bonding and packaging processes), an inspection step 206, and so on.

What is claimed is:

1. A scanning exposure method comprising the steps of:
   moving a mask having first and second patterns, and a substrate for display panel in synchronization; and
   exposing the first and second patterns on the substrate for display panel,
   wherein when the first and second patterns are exposed along a synchronous moving direction of the substrate for display panel, a part of the first pattern and a part of the second pattern overlap and are exposed, and a synchronous moving speed of the mask and the substrate for display panel when there is overlapping exposure is set different from a synchronous moving speed of the mask and the substrate for display panel when there is no overlapping exposure; and
   wherein a position of a blind plate which sets an illumination region along a direction orthogonal to a scanning direction during a scanning exposure is changed during the scanning exposure so that an overlapping region in which the overlapping exposure is performed extends in a direction that differs from an arrangement direction of the patterns which are arranged parallel to the scanning direction.

2. The scanning exposure method according to claim 1, wherein the first pattern and a third pattern adjacent to the first pattern in a direction orthogonal to the synchronous moving direction on the substrate for display panel have pluralities of unit patterns arrayed in different predetermined directions, and when the first and third patterns are exposed, the patterns overlap each other in a direction different from the arraying direction of the unit patterns.

3. A scanning exposure method comprising the steps of:
   moving a mask having a pattern, and a substrate for display panel with respect to a region illuminated with an exposing light, in synchronization; and
   exposing the pattern on the substrate for display panel, wherein a size of the illumination region in a direction intersecting with a synchronous moving direction of the substrate for display panel is synchronously changed during synchronous movement at the time of exposure in order that a locus of an end of the illumination region on the substrate for display panel is extended in a direction different from an arrangement direction of patterns which are arranged parallel to the synchronous moving direction.

4. The scanning exposure method according to claim 3, wherein the size of the illumination region is changed a plurality of times during the synchronous movement.

5. A scanning exposure method according to claim 3, wherein the illumination region has a pentagonal or hexagonal shape.

6. A scanning exposure method according to claim 3, wherein the size of the illumination region in a direction intersecting with the synchronous moving direction of the substrate for display panel is continuously changed during the synchronous movement.

7. A scanning exposure method according to claim 3, wherein an adjacent pattern is exposed so as to be partially overlapped with the pattern of the mask which was formed on the substrate for display panel.

8. A scanning exposure system which moves a mask having a pattern, and a substrate for display panel, in synchronization, and exposes the pattern on the substrate for display panel, comprising:
   an illumination region setting device which sets an illumination region of the mask; and
   a changing device which synchronously changes a size of the illumination region in a direction intersecting with a synchronous moving direction of the substrate for display panel during synchronous movement at the time of exposure in order that a locus of an end of the illumination region on the substrate for display panel is extended in a direction different from an arrangement direction of patterns which are arranged parallel to the synchronous moving direction.

9. A scanning exposure system which moves a mask having a pattern, and a substrate for display panel, in synchronization, and exposes the pattern on the substrate for display panel, comprising:
   an illumination region setting device which sets an illumination region of the mask; and
   a changing device which changes a size of the illumination region in a direction different from a synchronous moving direction of the substrate for display panel during synchronous movement,
   wherein the illumination region setting device includes a pair of blind plates which respectively have openings with a predetermined width in the synchronous moving direction and are movable in a direction that is different from the synchronous moving direction, and
   wherein a position of an illumination region along a direction orthogonal to a scanning direction during a scanning exposure is changed during the scanning exposure so that an overlapping region in which an overlapping exposure is performed extends in a direction that differs from an arrangement direction of patterns which are arranged parallel to the scanning direction.

10. A scanning exposure system according to claim 9, wherein the illumination region has a pentagonal or hexagonal shape.

11. A scanning exposure system according to claim 9, wherein the illumination region setting device provides the illumination region which has triangular ends.

12. A scanning exposure system which moves a mask having a pattern, and a substrate for display panel, in synchronization, and exposes the pattern on the substrate for display panel, comprising:

an illumination region setting device which sets an illumination region of the mask; and a changing device which changes a size of the illumination region in a direction different from a synchronous moving direction of the substrate for display panel during synchronous movement, wherein ends of the illumination region are inclined relative to an arrangement direction of patterns which are arranged parallel to the synchronous moving direction, and are exposed to an illumination gradient.

13. A scanning exposure system according to claim 12, further comprising an alignment member which performs alignment between the mask and the substrate to partially overlap a part of the pattern of the mask with a part of the pattern which was exposed on the substrate for display panel.

14. A scanning exposure system according to claim 13, wherein a synthesized pattern is formed by exposing a plurality of the patterns of the mask in a manner so as to partially overlap the plurality of the patterns.

15. A scanning exposure system which moves a mask having a pattern, and a substrate for display panel, in synchronization, and exposes the pattern on the substrate for display panel, comprising:

an illumination region setting device which sets an illumination region of the mask; and a changing device which changes a size of the illumination region in a direction different from a synchronous moving direction of the substrate for display panel during synchronous movement and changes a position of the illumination region along a direction orthogonal to a scanning direction during a scanning exposure so that an overlapping region in which an overlapping exposure is performed extends in a direction that differs from an arrangement direction of the patterns which are arranged parallel to the scanning direction, wherein the illumination region setting device includes at least one blind plate for providing the illumination region with a triangular end and at least one end light-shielding blind plate which covers the triangular end of the at least one illumination region.

16. A scanning exposure method comprising the steps of:

moving a mask having a pattern, and a substrate for display panel, with respect to a region illuminated with an exposing light, in synchronization; and exposing the pattern on the substrate for display panel, wherein a size of the illumination region in a direction intersecting with a synchronous moving direction of the substrate for display panel is synchronously changed during synchronous movement, a position of the illumination region along a direction orthogonal to a scanning direction is changed during a scanning exposure so that an overlapping region in which an overlapping exposure is performed extends in a direction that differs from an arrangement direction of patterns which are arranged parallel to the scanning direction, and wherein an overlapping part which is partially overlapped with the pattern is formed in a zigzag pattern.

17. A scanning exposure method according to claim 16, wherein an adjacent pattern, which is adjacent to the pattern in an orthogonal direction to the synchronous moving direction, is exposed so as to be partially overlapped with the pattern of the mask which was formed on the substrate for display panel.

18. A scanning exposure method according to claim 16, wherein an adjacent pattern which is adjacent to the pattern in the synchronous moving direction is exposed so as to be partially overlapped with the pattern of the mask which was formed on the substrate for display panel.

19. A scanning exposure method according to claim 17, wherein the adjacent pattern which is adjacent to the pattern in the synchronous moving direction is exposed so as to be partially overlapped with the pattern of the mask which was formed on the substrate for display panel.

20. A scanning exposure method comprising the steps of:

moving a mask having a pattern, and a substrate for display panel, with respect to an illumination region that is illuminated with an exposing light, in synchronization; and exposing the pattern on the substrate for display panel, wherein the illumination region is moved in a direction intersecting with a synchronous moving direction of the substrate for display panel during synchronous movement at the time of exposure so that an overlapping region in which an overlapping exposure is performed extends in a direction that differs from an arrangement direction of patterns which are arranged parallel to the synchronous moving direction.

21. A scanning exposure method according to claim 20, wherein a size of the illumination region in the direction intersecting with the synchronous moving direction of the substrate for display panel is continuously changed during the synchronous movement.

22. A scanning exposure method comprising the steps of:

moving a mask having a first and second patterns which have pluralities of unit patterns repeatedly arrayed in a predetermined direction, and a substrate for display panel, in synchronization; and exposing the first and second patterns on the substrate for display panel, wherein when the first and second patterns are exposed along a synchronous moving direction of the substrate for display panel, a part of the first pattern and a part of the second pattern overlap and are exposed, and a position or a width of an illumination region along direction orthogonal to the synchronous moving direction during a scanning exposure, is changed in order that a direction of a region in which the overlapping exposure is performed differs from an arraying direction of the unit patterns which are arranged substantially parallel to the synchronous moving direction.

23. The scanning exposure method according to claim 22, wherein the first pattern and a third pattern adjacent to the first pattern in a direction orthogonal to the synchronous moving direction on the substrate for display panel have pluralities of unit patterns arrayed in different predetermined directions, and when the first and third patterns are exposed, the patterns overlap each other in a direction different from an arraying direction of the unit patterns.

24. The scanning exposure method according to claim 33, wherein the size of the illumination region is changed a plurality of times during the syncrhronous movement.

* * * * *